(12) United States Patent
Belcher et al.

(10) Patent No.: US 9,590,278 B2
(45) Date of Patent: Mar. 7, 2017

(54) RECYCLING CAR BATTERIES FOR PEROVSKITE SOLAR CELLS

(71) Applicant: Massachusetts Institute of Technology, Cambridge, MA (US)

(72) Inventors: Angela M. Belcher, Lexington, MA (US); Po-Yen Chen, Cambridge, MA (US); Paula T. Hammond-Cunningham, Newton, MA (US); Jifa Qi, West Roxbury, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 0 days.

(21) Appl. No.: 14/820,241

(22) Filed: Aug. 6, 2015

(65) Prior Publication Data

US 2016/0043449 A1     Feb. 11, 2016

Related U.S. Application Data

(60) Provisional application No. 62/035,030, filed on Aug. 8, 2014, provisional application No. 62/050,706, filed on Sep. 15, 2014.

(51) Int. Cl.
*H01M 10/54* (2006.01)
*H01L 51/00* (2006.01)
*H01L 51/42* (2006.01)
*C22B 3/00* (2006.01)

(52) U.S. Cl.
CPC ............ *H01M 10/54* (2013.01); *C22B 13/04* (2013.01); *H01L 51/0077* (2013.01); *H01L 51/4253* (2013.01); *Y02W 30/84* (2015.05)

(58) Field of Classification Search
None
See application file for complete search history.

(56) References Cited

U.S. PATENT DOCUMENTS

2002/0079234 A1\* 6/2002 Turner .................... C22B 3/165
                                                                 205/466
2005/0168227 A1\* 8/2005 Naddei ................. H02J 7/0075
                                                                 324/433

OTHER PUBLICATIONS

Chen et al., "Environmentally responsible fabrication of efficient perovskite solar cells from recycled car batteries", Jul. 2014, Energy and Environmental Science, p. 3659-3665.*

\* cited by examiner

*Primary Examiner* — Nathan T Leong
(74) *Attorney, Agent, or Firm* — Steptoe & Johnson LLP

(57) ABSTRACT

An efficient perovskite solar cells can be synthesized from used car batteries by using both the anodes and cathodes of car batteries as material sources for the synthesis of lead iodide perovskite materials.

12 Claims, 23 Drawing Sheets

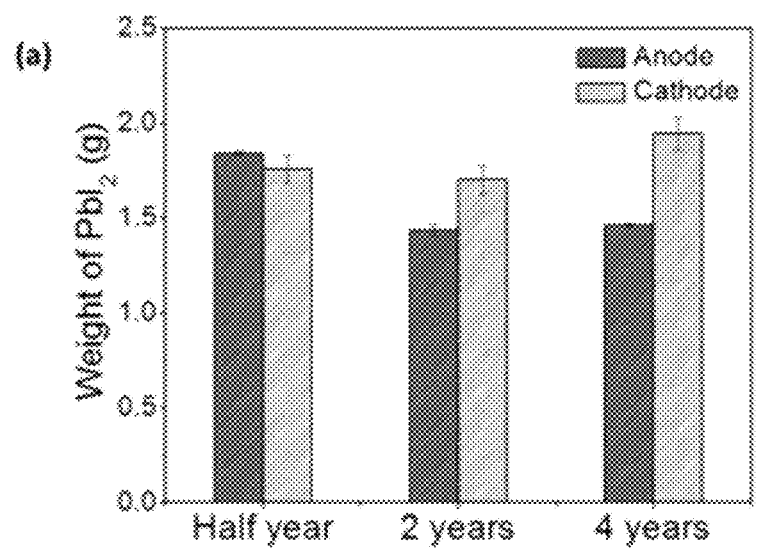
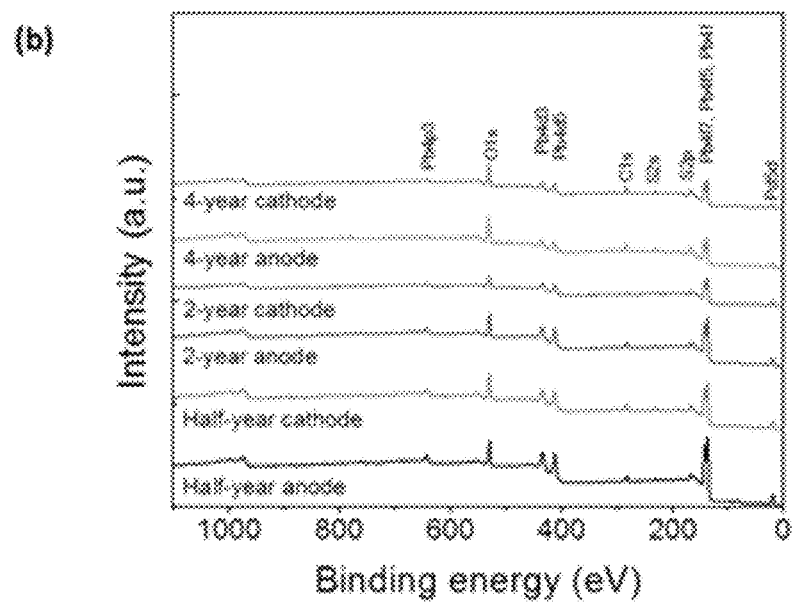
FIG. 15A
FIG. 15B

US 9,590,278 B2

RECYCLING CAR BATTERIES FOR PEROVSKITE SOLAR CELLS

CLAIM OF PRIORITY

This application claims priority to U.S. Provisional Application No. 62/035,030, filed on Aug. 8, 2014, and U.S. Provisional Application No. 62/050,706, filed on Sep. 15, 2014, each of which is hereby incorporated by reference in its entirety.

TECHNICAL FIELD

This invention relates to perovskite solar cells.

BACKGROUND

Perovskite materials have attracted wide-spread attention due to their catalytic, ferroelectric, and ferromagnetic properties as well as their application in superconductors, thermoelectrics, and fuel cells. Due to their unique ferroelectric and semiconductor properties, researchers are investigating the photovoltaic and photocatalytic properties of perovskite materials. Nanoscaled perovskite materials exhibit improved properties over bulk materials, and their unique characteristics are under investigation. However, using conventional methods to synthesize perovskite nanomaterials of small size and high crystallinity is difficult, and preparing them with different morphologies under environmentally friendly conditions presents an even greater challenge.

SUMMARY

A method of fabricating perovskite solar cells can include harvesting lead-derived materials from the anodes and cathodes of a car battery as a recovery solution, synthesizing recovered lead iodide from the lead-derived materials from the recovery solution, forming recovered lead iodide perovskite nanocrystals from the recovered lead iodide, and depositing the recovered lead iodide perovskite nanocrystals on a substrate.

The perovskite can have the formula (I):

wherein each of A and A', independently, can be a rare earth, alkaline earth metal, or alkali metal, each of B and B', independently, can be a transition metal, x is in the range of 0 to 1, y is in the range of 0 to 1, and δ can be in the range of 0 to 1. A and A', independently, can be selected from the group consisting of methylammonium, 5-aminovaleric acid, Mg, Ca, Sr, Ba, Pb, and Bi, and B and B', independently, can be selected from the group consisting of Pb, Sn, Ti, Zr, V, Nb, Mn, Fe, Ru, Co, Rh, Ni, Pd, Pt, Al, and Mg.

Alternatively, the perovskite materials for solar cells can have formular (II):

wherein A is methylammonium or 5-aminovaleric acid; B is lead (Pb) or tin (Sn); X is I, Br, or Cl; x is in the range of 0 to 1; and y is in the range of 0 to 1.

The perovskite can be a strontium titanate, a bismuth ferrite, a tantalum oxide, tantalum oxynitride, tantalum nitride, sodium tantalate, zirconium oxide/tantalum oxynitride, zirconium tantalum oxynitride, tantalum oxynitride, tantalum nitride, or zirconium tantalum nitride.

In certain circumstances, the anodes or cathodes of the car battery can include lead sulphate.

In certain circumstances, the lead iodide can be synthesized at room temperature.

In certain circumstances, hydrogen peroxide can be added to synthesize the recovered lead iodide. Harvesting lead-derived materials from the anodes and cathodes of a car battery as a recovery solution can include adding peroxide to an acidic solution including $PbO_2$.

Other aspects, embodiments, and features will be apparent from the following description, the drawings, and the claims.

BRIEF DESCRIPTION OF THE DRAWINGS

FIG. 3A is a graph depicting XRD analysis on the lead iodide perovskite nanocrystals fabricated from car batteries and high-purity commercial $PbI_2$. FIG. 3B is a graph depicting optical properties: absorption spectra of the $PbI_2$ films (dash lines) from car batteries and high-purity commercial product; absorption and PL spectra of lead iodide perovskite films (solid lines) coated on mesoporous $Al_2O_3$ substrates fabricated from car batteries and high-purity commercial $PbI_2$. FIG. 3C is a SEM image of the lead iodide perovskite nanocrystals synthesized from high-purity commercial $PbI_2$. FIG. 3D is a SEM image of the lead iodide perovskite nanocrystals synthesized from car batteries.

FIG. 4A is a graph depicting the static data of PCE distribution for multiple batches of PSCs (~65 devices in total). Each batch is around 10-12 devices. FIG. 4B is a graph depicting average efficiency and their highest performance of ten devices fabricated from car batteries and high-purity commercial PbI2. FIG. 4C is J-V curves of the most efficient devices and the related photovoltaic parameters listed in Table 1. FIG. 4C is a graph depicting the resistance of electron recombination of the device fabricated from car batteries and high-purity commercial $PbI_2$.

FIG. 5A is a graph depicting the XRD analysis on the high-purity lead powder and the lead particles from anodes of car batteries. FIG. 5B is a graph depicting the XRD analysis on the high-purity $PbO_2$ powder and the $PbO_2$ particles from cathodes of car batteries. FIG. 5C is a graph depicting the XRD analysis on the high-purity PbO powder and the PbO particles after the annealing of $PbO_2$ particles for 5 hours. FIG. 5D is a graph depicting the XRD analysis on the high-purity $PbI_2$ powder and the $PbI_2$ powders synthesized from the cathodes and anodes of car batteries.

FIGS. 9A-9C and FIGS. 9D-9E are the Nyquist diagrams corresponding to the impedance spectra under dark conditions in the applied voltages at 800 mV and 550 mV, respectively. Transmission line behaviors are clear visible in FIGS. 9B and 9E. The arcs in FIGS. 9C and 9F represent the impedance responses from the gold/hole-transporting material interface.

FIG. 15A shows the weight of $PbI_2$ products synthesized from one gram of the collected materials from anodes and cathodes in spent car batteries with different operation times. FIGS. 15B and 15C shows XPS measurements of the materials collected from anodes and cathodes in spent car batteries with different operation times before and after conversion to $PbI_2$ using the method disclosed here.

DETAILED DESCRIPTION

Figure 1:
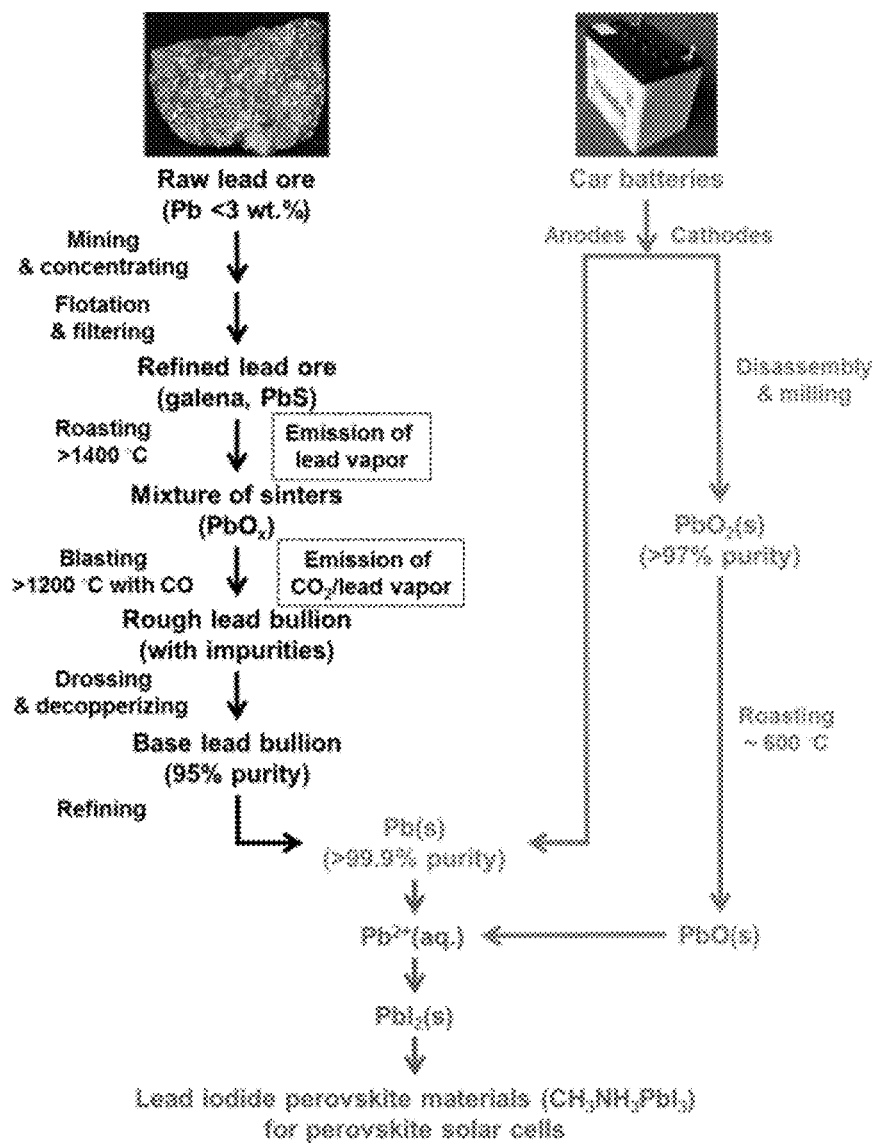
FIG. 1 is a schematic of the process to synthesize lead iodide perovskite materials from raw lead ore and from spent car batteries.

Organolead halide perovskite materials have recently attracted significant attention as an efficient light harvester and electron transporter for solid-state solar cells. See G. Xing, N. Mathews, S. Sun, S. S. Lim, Y. M. Lam, M. Grätzel, S. Mhaisalkar and T. C. Sum, *Science,* 2013, 342, 344, and S. D. Stranks, G. E. Eperon, G. Grancini, C. Menelaou, M. J. P. Alcocer, T. Leijtens, L. M. Herz, A. Petrozza and H. J. Snaith, *Science,* 2013, 342, 341, each of which is incorporated by reference in its entirety. Having achieved power conversion efficiencies over 15% with relatively simple and inexpensive fabrication methods, perovskite solar cells (PSCs) show great promise as a new large-scale and cost-competitive photovoltaic technology. See M. M. Lee, J. Teuscher, T. Miyasaka, T. N. Murakami and H. J. Snaith, *Science,* 2012, 338, 643, H. S. Kim, C. R. Lee, J. H. Im, K. B. Lee, T. Moehl, A. Marchioro, S. J. Moon, R. Humphry-Baker, J. H. Yum, J. E. Moser, M. M. Grätzel and N. G. Park, *Sci. Rep.,* 2012, 2, 591, M. Liu, M. B. Johnston and H. J. Snaith, *Nature,* 2013, 501, 395, J. Burschka, N. Pellet, S.-J. Moon, R. Humphry-Baker, P. Gao, M. K. Nazeeruddin and M. Grätzel, *Nature,* 2013, 499, 316, and R. F. Service, Science News, 2014, each of which is incorporated by reference in its entirety. However, there are health and environmental concerns regarding the current procedures used to mine and refine the lead necessary for synthesizing the organolead halide perovskite materials. The extraction from the raw lead ore, galena, requires high-temperature process over 1400° C. and generates greenhouse gases and dangerous fumes as byproducts. See C. A. Sutherland, E. F. Milner, R. C. Kerby, H. Teindl, A. Melin and H. M. Bolt, in *Ullmann's Encyclopedia of Industrial Chemistry,* Wiley, 2000, which is incorporated by reference in its entirety. It is challenging to fully enclose the lead vapor/dust escaped from processing facilities, and the toxic materials pose significant hazards to the environment and human health. See B. P. Lanphear, T. D. Matte, J. Rogers, R. P. Clickner, B. Dietz, R. L. Bornschein, P. Succop, K. R. Mahaffey, S. Dixon, W. Galke, M. Rabinowitz, M. Farfel, C. Rohde, J. Schwartz, P. Ashley and D. E. Jacobs, *Environ. Res.,* 1998, 79, 51, H. W. Mielke and P. L. Reagan, *Environ. Health Perspect.,* 1998, 106, 217, K. Koller, T. Brown, A. Spurgeon and L. Levy, *Environ. Health Perspect.,* 2004, 112, 987, and S. Tong, Y. E. Schirnding and T. Prapamontol, *Bull. World Health Organ.,* 2000, 78, 1068, each of which is incorporated by reference in its entirety. Therefore, alternative lead sources that are abundant, inexpensive, and allow safer extraction and processing procedures are imperative for future manufacture of lead-based PSCs in an environmentally-responsible fashion.

An alternative, readily-available lead source for synthesizing lead halide perovskite materials is the common lead-acid battery, the most widely-used automotive battery. See D. A. J. Rand, J. Garche, P. T. Moseley and C. D. Parker, *Valve-Regulated Lead-Acid Batteries.,* Elsevier, Amsterdam, 2004 and D. Pavlov, *Lead-Acid Batteries: Science and Technology,* Elsevier, Amsterdam, 2011, each of which is incorporated by reference in its entirety. The spent materials from lead-acid battery electrodes are currently harvested and reprocessed by manufacturers to produce over half of the new car batteries. On the other hand, rapid development of next-generation energy-storage technology has enabled lithium-based batteries, such as lithium-sulfur and lithium-air devices with higher energy densities, longer lifespans, lighter specific weights, and improved safety compared to the traditional lead-acid design. See M. Armand and J. M. Tarascon, *Nature,* 2008, 451, 652, P. G. Bruce, S. A. Freunberger, L. J. Hardwick and J.-M. Tarascon, *Nat. Mater.,* 2012, 11, 19, and V. Etacheri, R. Marom, R. Elazari, G. Salitra and D. Aurbach, *Energy Environ. Sci.,* 2011, 4, 3243, each of which is incorporated by reference in its entirety. As a result, when the next generation technologies inevitably replace the lead-acid batteries in automobiles, the lead recycling process will be disrupted. The environmentally-hazardous materials from over 250 million retired lead-acid batteries (estimated on the number of registered passenger vehicles in the United States alone) will need to be disposed or repurposed in an environmentally-responsible manner. See *Number of U.S. aircraft, vehicles, vessels, and other conveyances,* U.S. Department of Transportation, 2011, which is incorporated by reference in its entirety. The benefits of reprocessing these materials to manufacture PSCs are two-folds: the disposal of a large quantity of lead-acid batteries can be managed in an inexpensive way, which provides readily-available lead sources and facilitates the synthesis of perovskite materials for renewable energy production.

In general, a perovskite can have the formula (I):

$$A_xA'_{1-x}B_yB'_{1-y}O_{3\pm\delta} \quad (I)$$

where each of A and A', independently, is a rare earth, alkaline earth metal, or alkali metal, x is in the range of 0 to 1, each of B and B', independently, is a transition metal, y is in the range of 0 to 1, and δ is in the range of 0 to 1. δ can represent the average number of oxygen-site vacancies (i.e., −δ) or surpluses (i.e., +δ); in some cases, δ is in the range of 0 to 0.5, 0 to 0.25, 0 to 0.15, 0 to 0.1, or 0 to 0.05. For clarity, it is noted that in formula (I), B and B' do not represent the element boron, but instead are symbols that each independently represent a transition metal. In some cases, δ can be approximately zero, i.e., the number of oxygen-site vacancies or surpluses is effectively zero. The material can in some cases have the formula $AByB'1-yO_3$ (i.e., when x is 1 and δ is 0); $AxA'1xBO_3$ (i.e., when y is 1 and δ is 0); or $ABO_3$ (i.e., when x is 1, y is 1 and δ is 0).

Rare earth metals include Sc, Y, La, Ce, Pr, Nd, Pm, Sm, Eu, Gd, Tb, Dy, Ho, Er, Tm, Yb, or Lu. Alkaline earth metals include Be, Mg, Ca, Sr, Ba, and Ra. Alkali metals include Li, Na, K, Rb, and Cs. Transition metals include Sc, Ti, V, Cr, Mn, Fe, Co, Ni, Cu, Zn, Y, Zr, Nb, Mo, Tc, Ru, Rh, Pd, Ag, Cd, Hf, Ta, W, Re, Os, Ir, Pt, Au, or Hg. Particularly useful alkaline earth metals can include Ca, Sr, and Ba. Particularly useful transition metals can include first-row transition metals, for example, Cr, Mn, Fe, Co, Ni, and Cu. Representative materials of formula (I) include calcium titanate ($CaTiO_3$), barium titanate ($BaTiO_3$), strontium titanate ($SrTiO_3$), barium ferrite ($BaFeO_3$), $KTaO_3$, $NaNbO3$, $PbTiO_3$, $LaMnO_3$, $SrZrO_3$, $SrHfO_3$, $SrSnO_3$, $SrFeO_3$, $BaZrO_3$, $BaHfO3$, $KNbO_3$, $BaSnO_3$, $EuTiO_3$, $RbTaO_3$, $GdFeO_3$, $PbHfO_3$, $LaCrO_3$, $PbZrO_3$, or $LiNbO_3$.

Alternatively, the perovskite materials for solar cells can have formular (II):

$$A_xB_yX_3$$

wherein A is methylammonium or 5-aminovaleric acid; B is lead (Pb) or tin (Sn); X is I, Br, or Cl; x is in the range of 0 to 1; and y is in the range of 0 to 1. For example, the perovskite can be an organolead iodide perovskite.

Disclosed herein is a method to reuse car batteries for the fabrication of efficient PSCs in an environmentally responsible way. The anodes and cathodes of car batteries are both reused to synthesize lead iodide perovskite materials. In contrast to the traditional lead extraction process, the production of lead components from car batteries involves neither the high-temperature pyrometallurgical process nor the emission of lead vapor/dusts and greenhouse gases to the environment. The lead iodide perovskite films synthesized from car batteries and high-purity reagent demonstrate the same material characterizations (i.e., crystallinity, morphology, optical absorption, and photoluminescence property). The photovoltaic performance of the PSCs fabricated from either material sources are the same, indicating that device quality is not contingent on the source if proper processing procedures are followed. In addition, the resulting PSCs are measured by electrochemical impedance spectroscopy (EIS), and the similarity between the resistances of electron recombination indicates that the electron-transport properties of the lead iodide perovskite from two different sources are identical. Moreover, an economic analysis shows that the lead from one car battery will enable the fabrication of ~709.0 m² perovskite-based solar panels, which can support the electricity usage of ~30.2 US residential units in Las Vegas, Nev. (average daily electricity consumption for an United States residential unit is 29.1 kWh day⁻¹). See *Average monthly residential electricity consumption, prices, and bills by state*, U.S. Energy Information Administration 2012, and *Electric sales, revenue, and average price*, U.S. Department of Transportation, 2011, each of which is incorporated by reference in its entirety. With this technique, the time required to find a lead replacement for PSCs can be further elongated.

In general, a method of fabricating perovskite solar cells can include harvesting lead-derived materials from the anodes and cathodes of a car battery as a recovery solution, synthesizing recovered lead iodide from the lead-derived materials from the recovery solution, forming recovered lead iodide perovskite nanocrystals from the recovered lead iodide, and depositing the recovered lead iodide perovskite nanocrystals on a substrate.

FIG. 1 provides a flowchart that compares two processes to synthesize perovskite materials. The conventional process begins with freshly mined galena whereas the herein-disclosed process begins with spent car batteries. The traditional extraction of lead from galena involves two high-temperature processes: (1) a pre-roasting oxidation step (>1400° C.) to turn galena into lead oxides ($PbO_x$) and (2) a pyrometallurgical process (>1200° C.) to reduce $PbO_x$ to lead. See *Energy and environmental profile of the U.S. mining industry*, U.S. Department of Energy (DOE), 2002, which is incorporated by reference in its entirety. Both procedures require high-energy input and generate carbon dioxide ($CO_2$) as an undesired byproduct. Furthermore, lead vapor and dust can escape with the exhaust into the atmosphere, which can then accumulate in the surroundings and endanger human and ecological health. In contrast to the complicated, energy-intensive, and potentially hazardous pathways starting from galena, the production from car batteries is more straightforward and with minimal emission of harmful byproducts. The synthesis occurs at a lower temperature (~600° C.) and does not release any $CO_2$. By reusing spent lead-based materials from car batteries, emerging PSC manufacturers could source raw materials from existing waste rather than mining and processing new ore with the aforementioned traditional methods.

Figure 2:
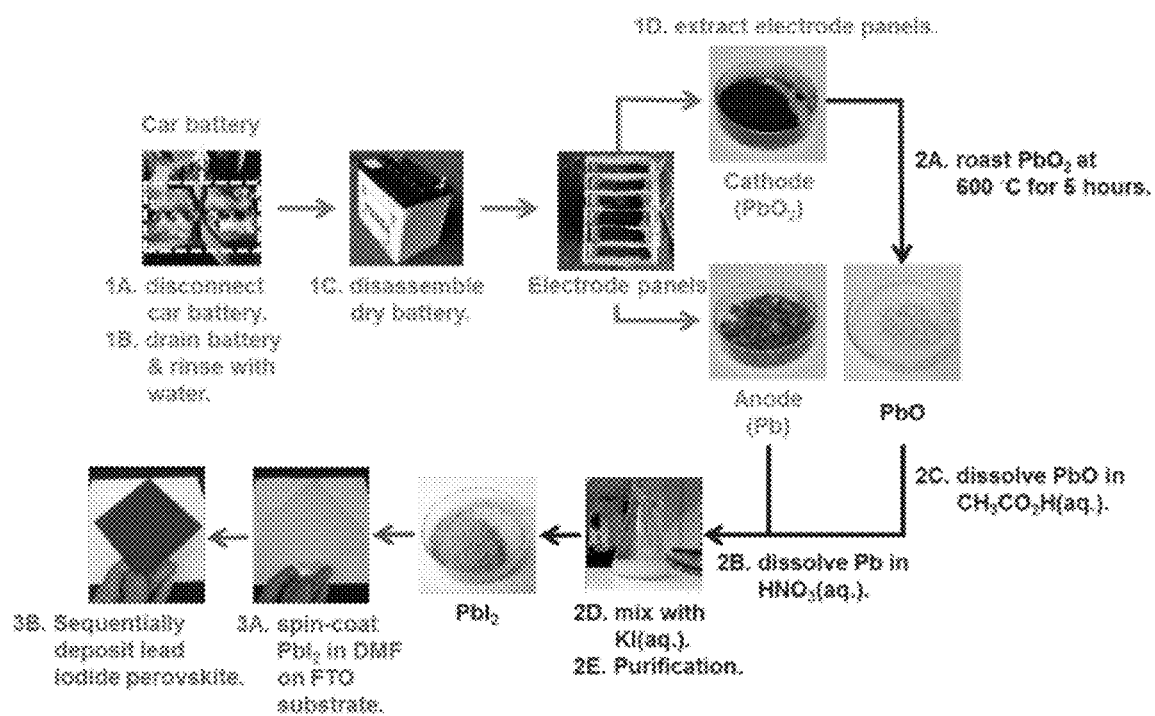
FIG. 2 depicts the synthetic process of lead iodide perovskite materials from a lead-acid car battery.
Figure 5A:
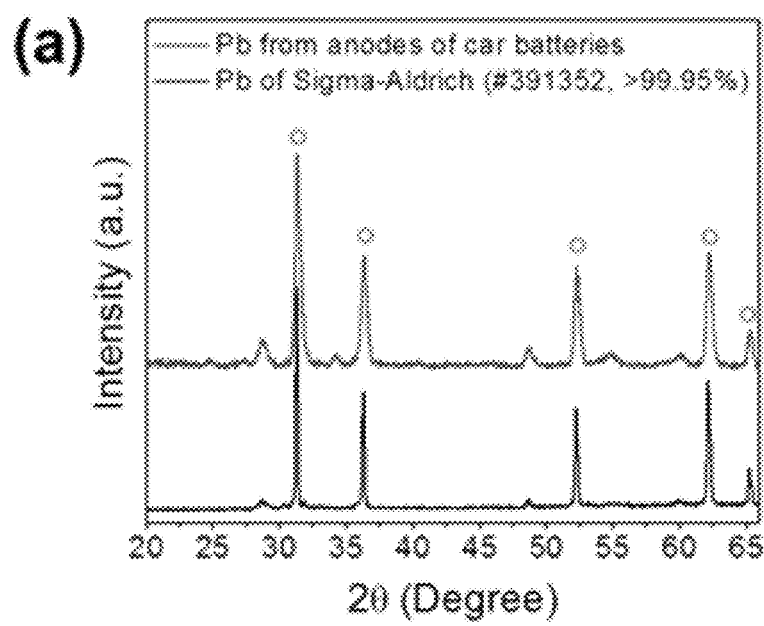
FIGS. 5A-5D show materials characterizations.
Figure 5B:
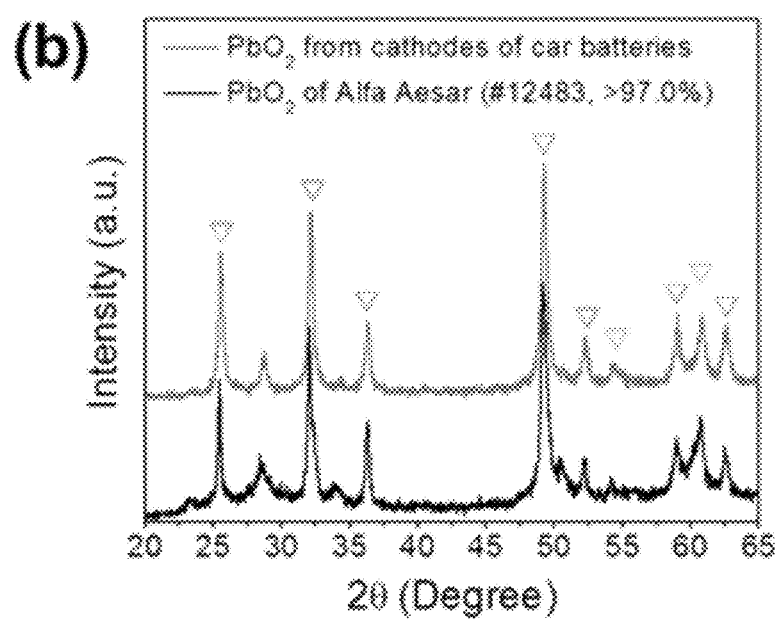
Figure 5C:
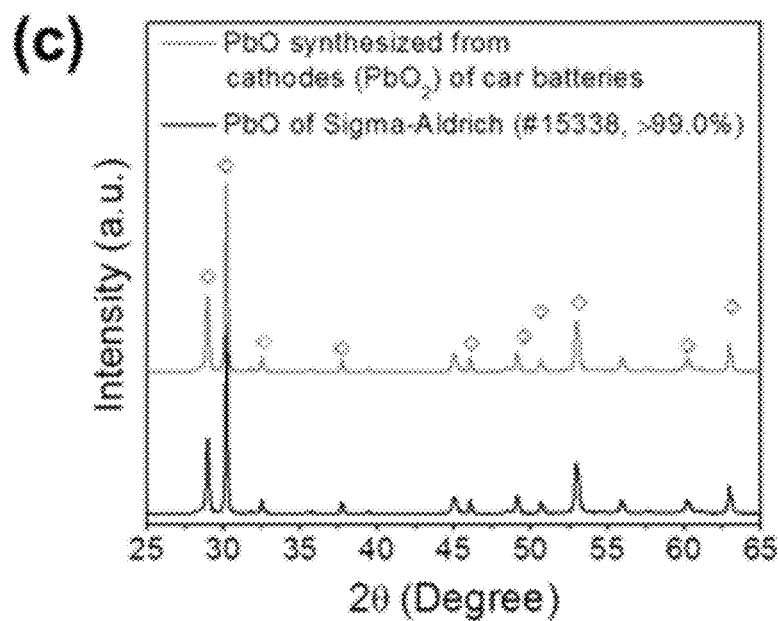
Figure 5D:
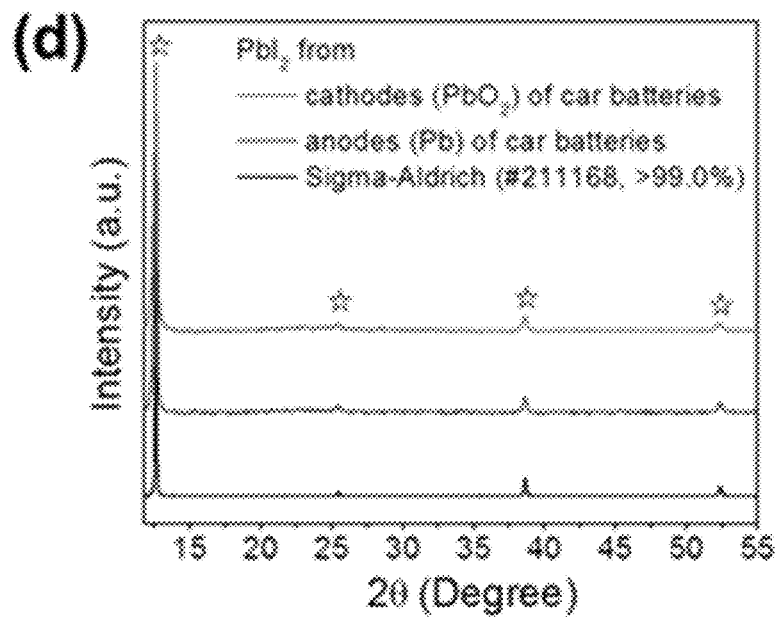
Figure 6:
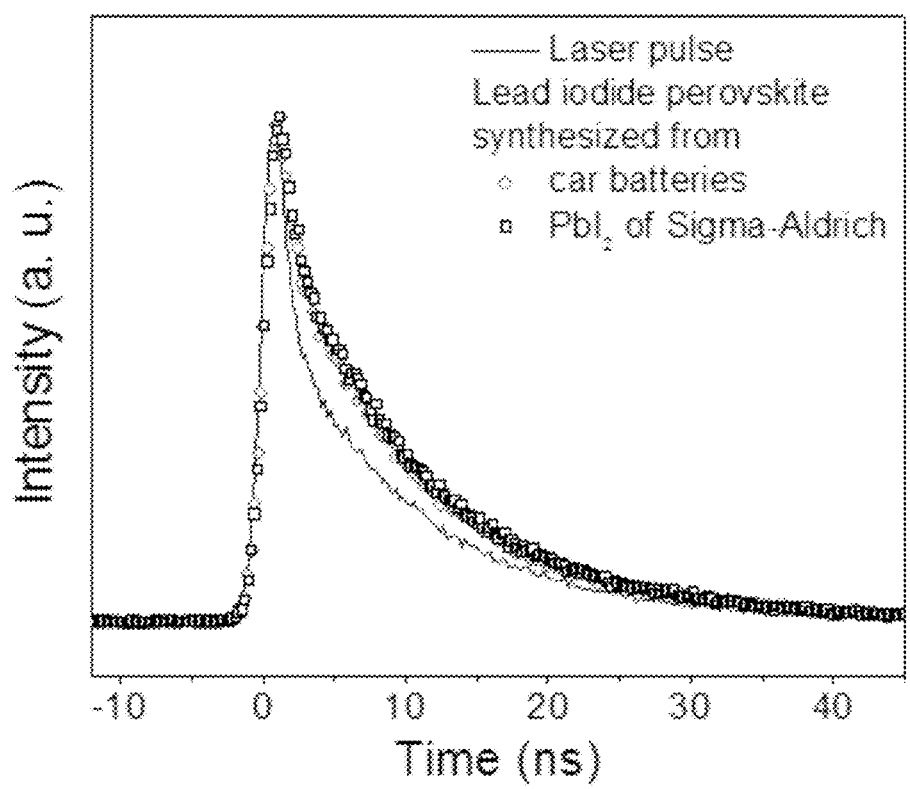
FIG. 6 is a graph depicting PL response of perovskite films. Normalized time resolved photoluminescence intensity from the lead iodide perovskite films synthesized from car batteries and commercial $PbI_2$ powder.

FIG. 2 shows the detailed synthesis of lead iodide perovskite materials from a spent lead-acid car battery. The process includes three steps: (1) harvesting material from the anodes and cathodes of car battery, (2) synthesizing $PbI_2$ from the collected materials, and (3) depositing lead iodide perovskite nanocrystals. First, a used 12-V lead-acid battery is disconnected from an automobile. After disconnection, the acid electrolyte (containing concentrated sulfuric acid) is diluted with water and then poured out. The electrodes are further rinsed with water several times and air-dried for two days. The dry car battery is then disassembled with jigsaw from the top casing to avoid damaging the electrodes. After removal of the casing, the electrode panels become accessible. The disassembly process is conducted by a professional technician, and the toxic waste materials are properly collected and disposed. The disassembled lead-acid battery includes 36 anodes (lead) and 36 cathodes ($PbO_2$), with the dimension of each electrode around 15 cm×15 cm×0.25 cm. The lead-derived materials on the current collectors are scraped off and rinsed with dilute HCl. The collected materials are then ground into fine powders for further processing. As shown in FIGS. 5 and 6, the as-obtained lead and $PbO_2$ powders produce identical XRD patterns to the high-purity chemicals of Sigma-Aldrich (#391352, >99.95%) and Alfa Aesar (#12483, >97.0%).

To synthesize $PbI_2$ with high yields, the as-obtained lead and $PbO_2$ powders are treated with different synthetic pathways. Because of the low reactivity of $PbO_2$ in $HNO_3$, the generation of $Pb^{2+}$ is inefficient and the yield is lower than 5% (equation 1).

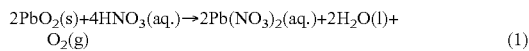

$$2PbO_2(s)+4HNO_3(aq.)\rightarrow 2Pb(NO_3)_2(aq.)+2H_2O(l)+O_2(g) \quad (1)$$

As a result, $PbO_2$ requires a composite treatment: first, the powder is sintered at 600° C. for 5 hours in air to decompose $PbO_2$ into PbO (equation 2).

$$PbO_2(s)\rightarrow PbO(s)+1/2O_2(g) \quad (2)$$

The complete transformation is confirmed visually by the color change from dark red to yellow, and quantitatively by matching the XRD pattern of the as-obtain PbO (FIG. 5C) to that of the high-purity PbO of Sigma-Aldrich (#15338, >99.0%). The as-synthesized PbO powder is highly soluble in dilute acetic acid (1.9 M), and $Pb^{2+}$ is generated efficiently in the solution. Lead powder from anodes is reduced by dilute $HNO_3$ (0.8 M) and the yield of $Pb^{2+}$ is close to 100% (equation 3).

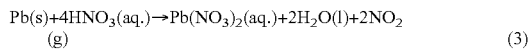

$$Pb(s)+4HNO_3(aq.)\rightarrow Pb(NO_3)_2(aq.)+2H_2O(l)+2NO_2(g) \quad (3)$$

After both electrodes are transformed into $Pb^{2+}$ completely, the solutions are both mixed with the potassium iodide (KI) solution. $Pb^{2-}$ reacts with $I^-$ and yields insoluble yellow $PbI_2$ products immediately. After washing with cold water, the as-obtained $PbI_2$ is collected and dried in a vacuum oven overnight. The resulting $PbI_2$ from car batteries are characterized by XRD analysis, and the XRD pattern are identical to that of the high-purity $PbI_2$ (Sigma-Aldrich, #211168, >99%) (FIG. 5D).

Figure 3A:
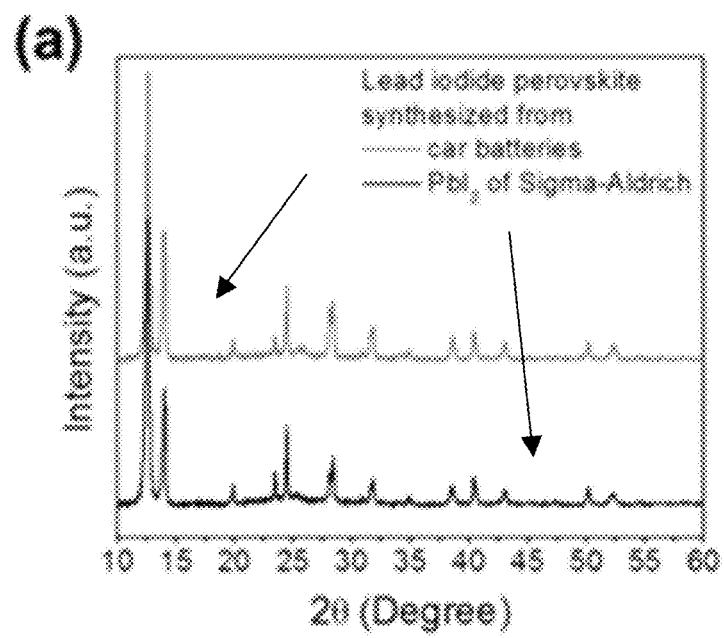
FIGS. 3A-3D show materials characterizations.

After $PbI_2$ is synthesized, lead iodide perovskite nanocrystals are synthesized by the reported sequential deposition process. See J. Burschka, N. Pellet, S.-J. Moon, R. Humphry-Baker, P. Gao, M. K. Nazeeruddin and M. Grätzel, *Nature*, 2013, 499, 316, which is incorporated by reference in its entirety. $PbI_2$ is introduced into the $TiO_2$ nanoparticle-based films by spin-coating a solution of $PbI_2$ in DMF at 80° C. The $PbI_2/TiO_2$ composite films are dipped into a solution of $CH_3NH_3I$ in IPA, and the films change color immediately from yellow to dark brown, indicating the formation of lead iodide perovskite (i.e., $CH_3NH_3PbI_3$). XRD pattern of the perovskite nanocrystals from car batteries exhibits the same crystallinity to the one from high-purity $PbI_2$ of Sigma-Aldrich (FIG. 3A).

The study of photophysical properties enables the characterization of organometallic lead halide perovskite and the understanding of the charge photogeneration and recombination mechanisms. See, F. Deschler, M. Price, S. Pathak, L. E. Klintberg, D.-D. Jarausch, R. Higler, S. Hüttner, T. Leijtens, S. D. Stranks, H. J. Snaith, M. Atatüre, R. T. Phillips and R. H. Friend, *J. Phys. Chem. Lett.*, 2014, 5, 1421, which is incorporated by reference in its entirety. To evaluate the light-harvesting capability between the lead halide perovskite materials synthesized from car batteries and commercial $PbI_2$, the optical absorbance and the photoluminescence (PL) response of the fabricated thin films are characterized. The thin films synthesized from both sources are prepared under the same parameters as the fabricated devices (e.g., the concentration of $PbI_2$ and methylamine iodide solutions, the spin-coating speed/time, and the drying temperature/time). As a result, the thickness of the $PbI_2$—and perovskite-coated thin films for the optical and PL measurements is almost the same as the thickness in the fabricated devices.

Figure 3B:
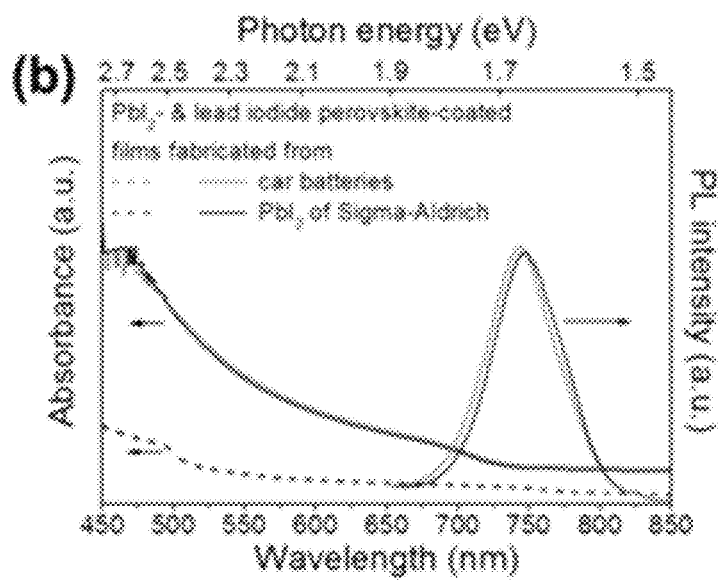

The absorption spectra of $PbI_2$- and perovskite-coated films (from car batteries and high-purity commercial reagent) are plotted in FIG. 3B. The absorption of both $PbI_2$-coated films is under 450 nm, and the resulting perovskite-coated $TiO_2$ films show an increased absorbance and a broad absorption ranging from below 400 nm to 850 nm. The identical absorption spectra indicates that the light harvesting ability of perovskite materials synthesized from the car electrodes is identical to those made from high-purity reagents. The PL spectra of lead iodide perovskite nanocrystals deposited on mesoporous alumina oxide ($Al_2O_3$) thin films from both sources exhibit a strong single emission band (FIG. 3B). The spectral features of the samples from two sources are the same: spectral peak position is around 747±2 nm (1.66 eV), and the half-width at half-maximum (HWHM) is both 130±3 meV, as well as the same integrated intensities. The strong emission is attributed to the radiative recombination of excitons localized in organolead iodide perovskite nanocrystals. Furthermore, the dynamics of PL of both organolead iodide perovskite nanocrystals is investigated by monitoring the PL decay at 747 nm (shown in FIG. 6). All samples exhibit a single exponential relaxation process with the same lifetime of 1.00±0.09 ns.

Figure 3C:
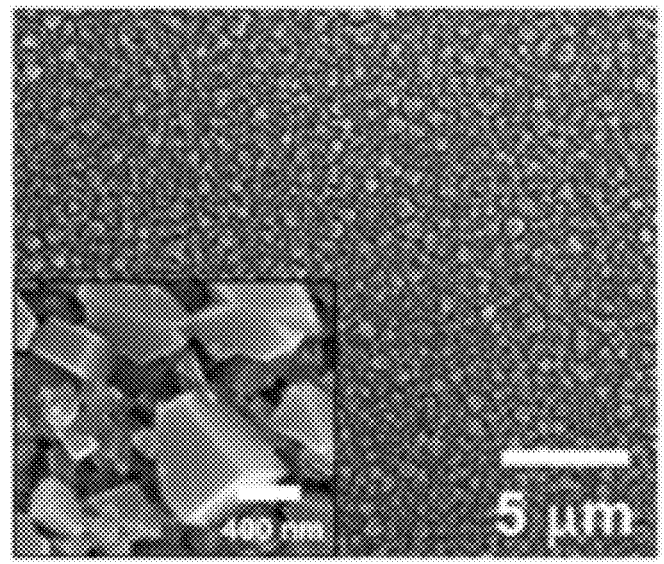
Figure 3D:
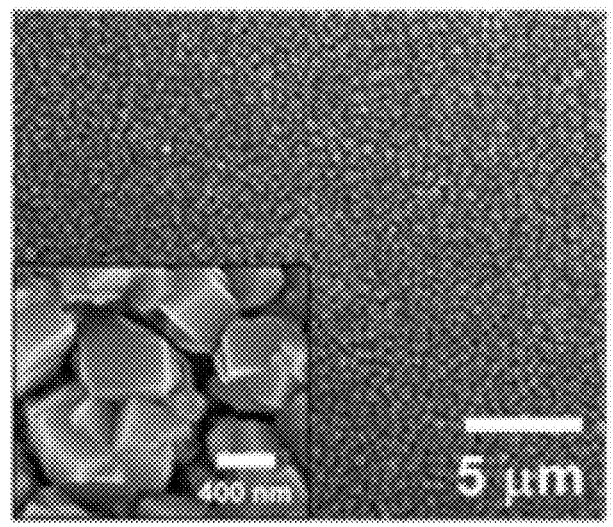

The identical absorption and PL spectral properties demonstrate that materials sourced from batteries and high-purity reagents display the same optical transitions from ground states to excited states, and vice versa. The similarity indicates that both batches of nanocrystals display the same chemical structure and the identical light-absorption capability. The crystallized morphologies of both perovskite nanocrystals are visualized by scanning electron microscopy (SEM), and the images are shown in FIGS. 3C and 3D. In FIGS. 3C and 3D, the morphologies synthesized from both sources are similar with the crystal size from 20 nm to 400 nm, and the film coverage, as analyzed by image processing (ImageJ), is close to 100%.

Figure 4A:
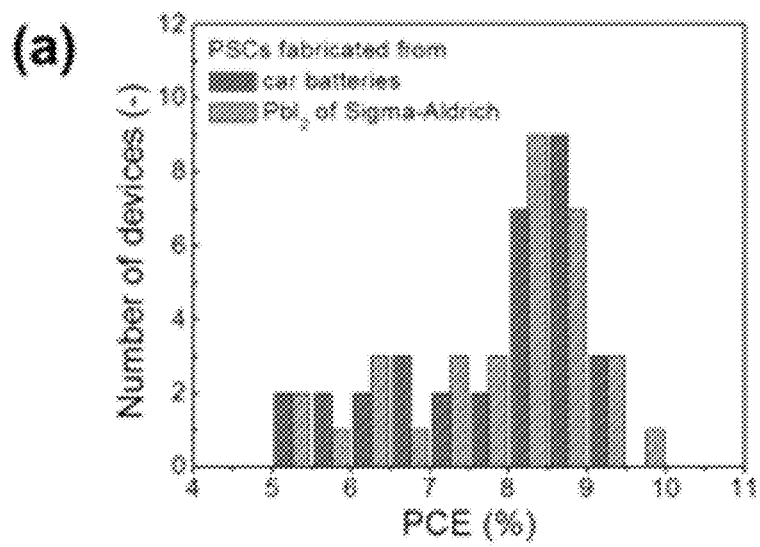
FIGS. 4A-4D show device characterizations.
Figure 4B:
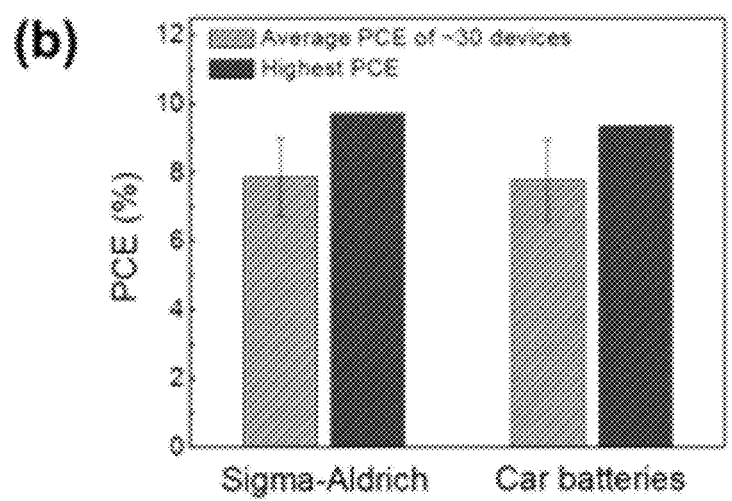
Figure 4C:
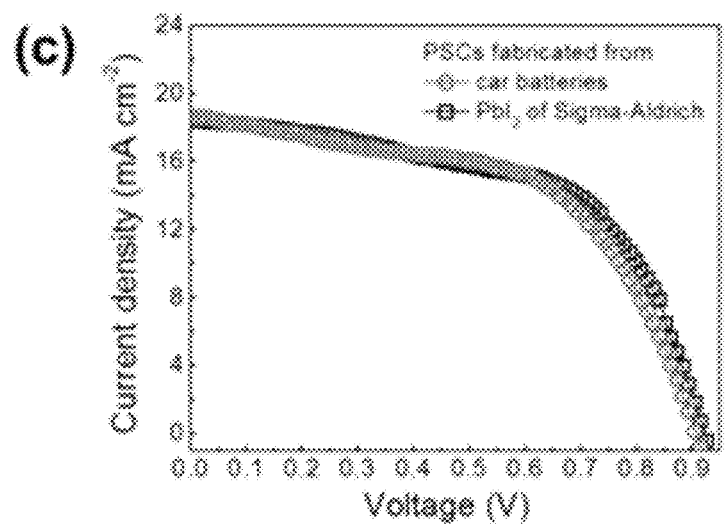
Figure 8A:
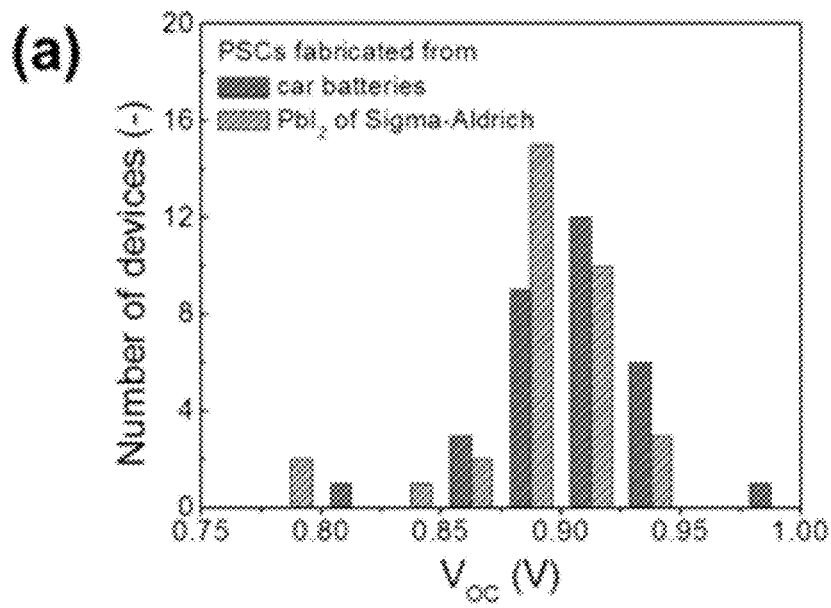
FIGS. 8A-8C are static data of photovoltaic performance of PSCs fabricated from car batteries and high-purity $PbI_2$. Histogram plots of solar cell performance parameters: $V_{OC}$ (FIG. 8A), $J_{SC}$ (FIG. 8B), and FF (FIG. 8C) from multiple batches of $CH_3NH_3PbI_3$-sensitized $TiO_2$ photovoltaic devices (total of 65 devices).
Figure 8B:
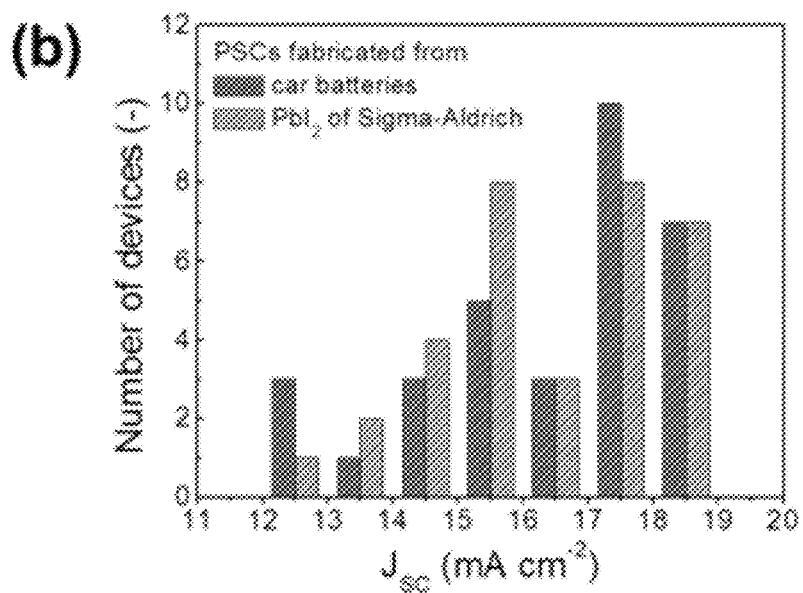
Figure 8C:
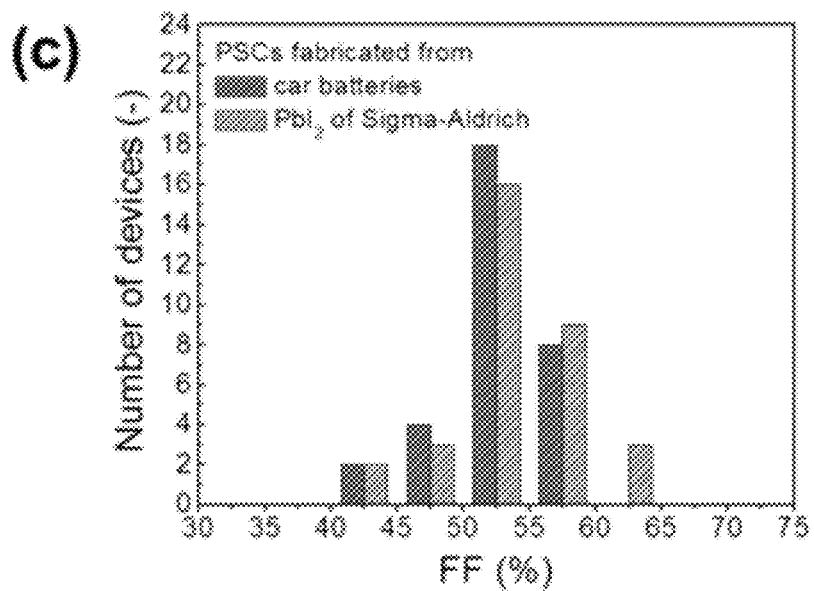

After the PSCs are assembled, the photovoltaic performance of the PSCs fabricated from car batteries and high-purity $PbI_2$ are both tested under AM 1.5 G illumination conditions (100 mW $cm^{-2}$). To compare the photovoltaic performance between the PSCs fabricated from car batteries and high-purity $PbI_2$, a histogram of the PCE from batches of ~32 PSCs is shown in FIG. 4A. Histogram plots of solar cell performance parameters, including open-circuit voltage (VOC), short-circuit current (JSC), and fill factor (FF), are also shown in FIG. 8. In addition, FIG. 4B presents the average PCE and the highest PCE from batches of PSCs. The current density-voltage (J-V) curves of the most efficient PSC are plotted in FIG. 4C, and the related photovoltaic parameters are listed in Table 1. From these photovoltaic measurements, it is clearly demonstrated that the PSCs fabricated from either of the two sources show similar photovoltaic performance, indicating car batteries can serve as an alternative lead sources for the environmentally-responsible fabrication of lead-based PSCs. FIG. 4A presents the average efficiency and the highest performance from a set of ten devices fabricated from either of the two sources. The current density-voltage (J-V) curves of the most efficient devices are plotted in FIG. 4B, and the related photovoltaic parameters (e.g., open-circuit voltage ($V_{OC}$), short-circuit current density ($J_{SC}$), and fill factor (FF)) are listed in Table 1. In FIGS. 4A and 4B and Table 1, the average efficiency and the parameters of the most efficient devices are close to identical, indicating that the perovskite materials made from either sources exhibit the same photovoltaic performance characteristics.

TABLE 1

Photovoltaic parameters. The related photovoltaic parameters (including device performance, open-circuit voltage ($V_{OC}$), short-circuit current density ($J_{SC}$), and fill factor (FF)) in FIG. 4b.

| PSC fabricated from | Device performance (%) | $V_{OC}$ (mV) | $J_{SC}$ (mA cm$^{-2}$) | FF (%) |
|---|---|---|---|---|
| PbI$_2$ (Sigma-Aldrich) | 9.73 | 921 | 18.42 | 57.3 |
| Car batteries | 9.37 | 910 | 18.60 | 55.4 |

Figure 4D:
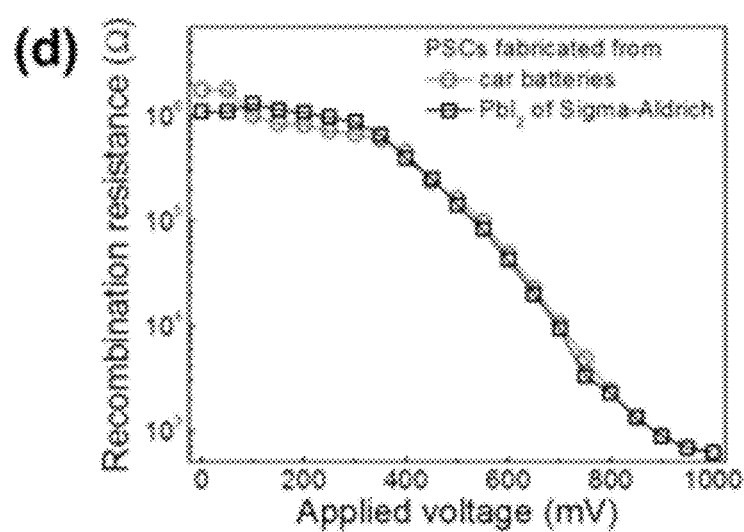
Figure 7:
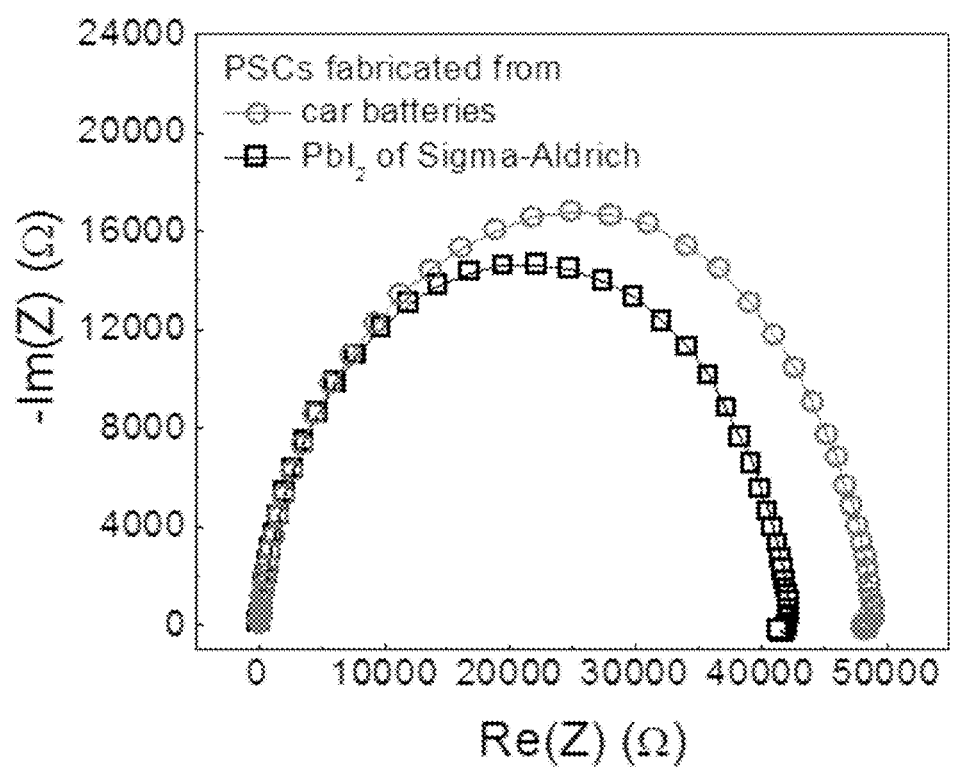
FIG. 7 is a graph depicting impedance response.
Figure 9A:
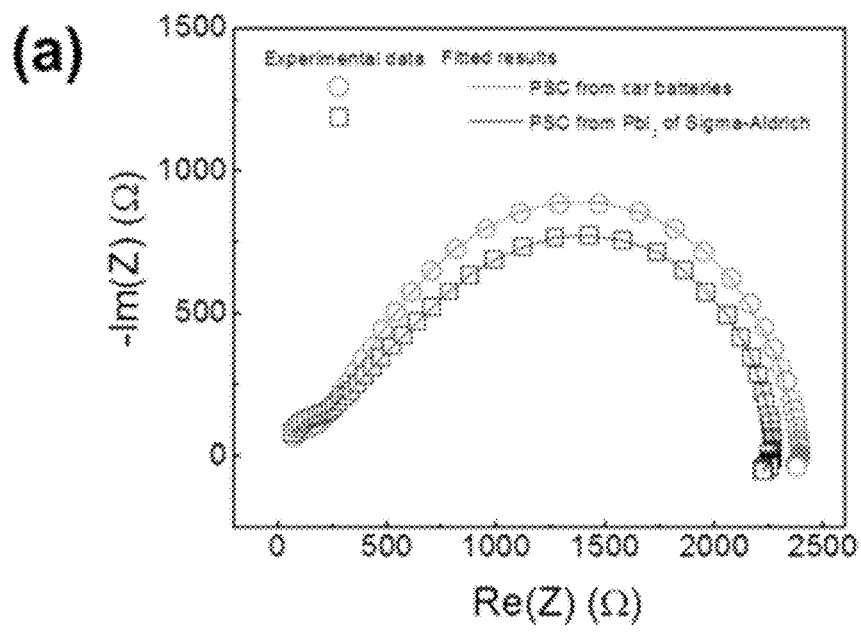
FIGS. 9A-9F are Nyquist diagrams of PSCs fabricated from car batteries and high-purity commercial $PbI_2$.
Figure 9B:
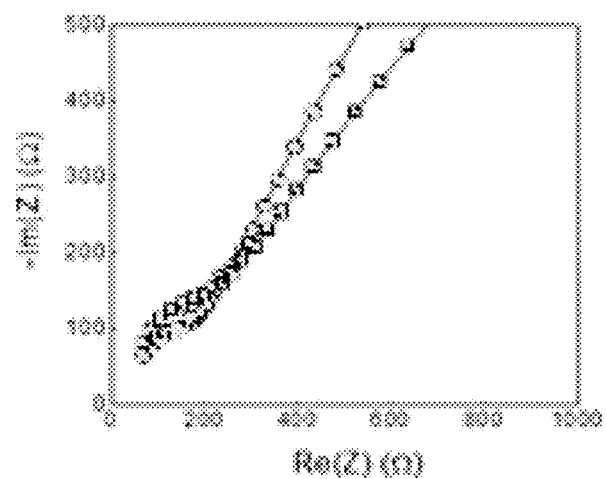
Figure 9C:
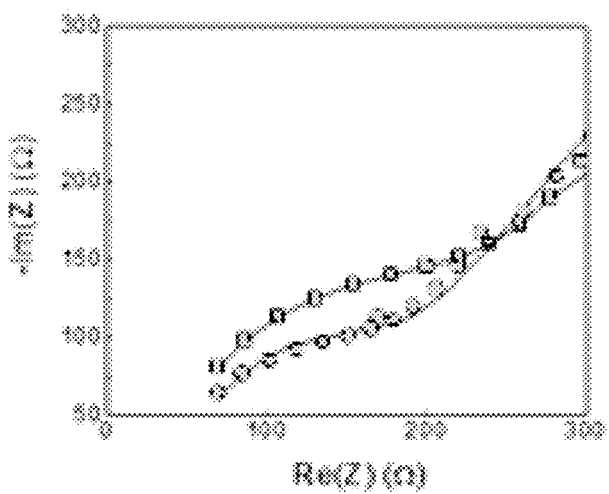
Figure 9D:
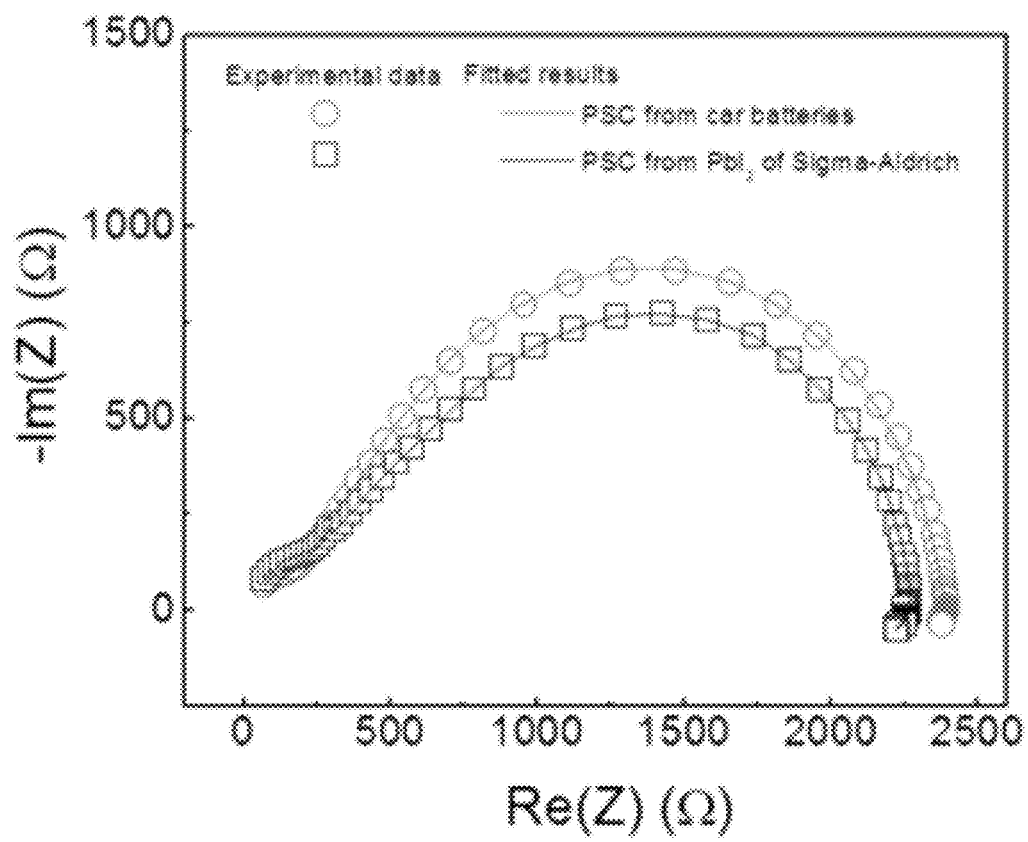
Figure 9E:
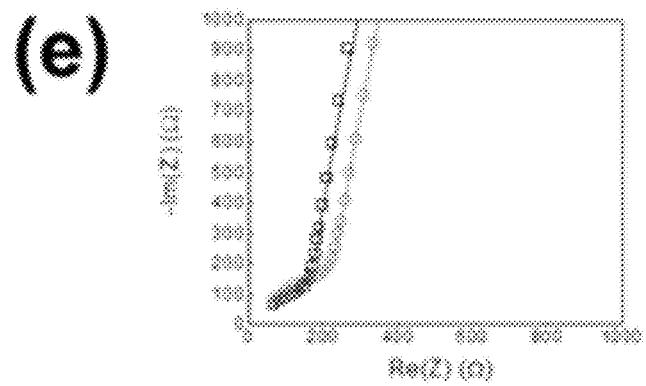
Figure 9F:
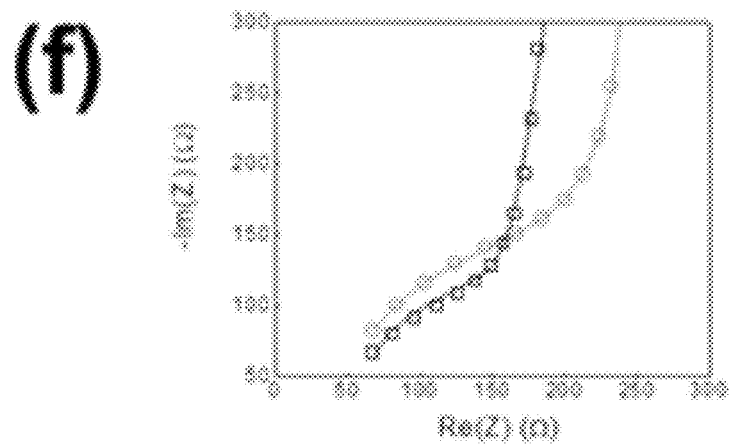

Furthermore, the two kinds of PSCs are characterized by EIS and the resistances of electron recombination are analyzed by fitting the resulting impedance spectra (FIG. 7), where Nyquist diagrams of the EIS spectra were obtained under dark condition at 600 mV for the devices fabricated from car batteries and high-purity commercial PbI$_2$. Nyquist plots of solid-state PSCs fabricated from car batteries and high-purity PbI$_2$ at 550 mV and 800 mV are both shown in FIG. 9. Nyquist plots at 800 mV (FIGS. 9B and 9C) and 550 mV (FIGS. 9E and 9F) are both enlarged to observe the detailed features in intermediate and high frequency region. At high frequency (FIGS. 9C and 9F), the gold/hole-transporting material interface is similar to the interface between the liquid electrolyte and the counter electrode in dye-sensitized solar cells (DSCs). See, J. Bisquert, J. Phys. Chem. B, 2001, 106, 325, which is incorporated by reference in its entirety. The resistance at this interface remains almost the same over the whole applied voltage range, and the resistance slightly reduce at higher applied voltage, which is often observed in the literature. A. Dualeh, T. Moehl, N. Tétreault, J. Teuscher, P. Gao, M. K. Nazeeruddin and M. Grätzel, ACS Nano, 2014, 8, 362, which is incorporated by reference in its entirety. Moreover, at intermediate frequency (FIGS. 9B and 9E), the straight characteristics of transmission line, which is normally observed in the nanostructured photoanodes, are seen. The transmission lines merge into the semicircles representing the recombination resistance at lower frequency. After PSCs from either of the two sources are characterized by EIS, the spectra are analyzed by following the reported model. See, A. Dualeh, T. Moehl, N. Tétreault, J. Teuscher, P. Gao, M. K. Nazeeruddin and M. Grätzel, ACS Nano, 2014, 8, 362, V. Gonzalez-Pedro, E. J. Juarez-Perez, W.-S. Arsyad, E. M. Barea, F. Fabregat-Santiago, I. Mora-Sero and J. Bisquert, Nano Lett., 2014, 14, 888, H.-S. Kim, I. Mora-Sero, V. Gonzalez-Pedro, F. Fabregat-Santiago, E. J. Juarez-Perez, N.-G. Park and J. Bisquert, Nat. Commun., 2013, 4, and F. Fabregat-Santiago, J. Bisquert, L. Cevey, P. Chen, M. Wang, S. M. Zakeeruddin and M. Grätzel, J. Am. Chem. Soc., 2008, 131, 558, each of which is incorporated by reference in its entirety. The recombination resistances of the devices fabricated from car batteries and high-purity PbI$_2$ are shown in FIG. 4D. The similarity of the resistances of electron recombination in FIG. 4D indicates that the electron-transport properties of the lead iodide perovskite synthesized from the two different sources are identical. From these photovoltaic measurements, it is clearly demonstrated that car batteries can serve as an alternative lead sources for the environmentally-responsible fabrication of lead-based PSCs.

To highlight the feasibility of producing perovskite materials using this environmentally-responsible approach, a simple economic analysis is performed. The average weight of a lead-acid battery is around 18.1 kg, and the lead-related materials are responsible for about 60% of the weight (~10.9 kg), while the other 40 wt. % is comprised of the liquid electrolyte, outer casing, separators, and current collectors. See, D. A. J. Rand, J. Garche, P. T. Moseley and C. D. Parker, Valve-Regulated Lead-Acid Batteries., Elsevier, Amsterdam, 2004, and D. Pavlov, Lead-Acid Batteries: Science and Technology, Elsevier, Amsterdam, 2011, each of which is incorporated by reference in its entirety. It is assumed that the weight of the anodes and cathodes are the same (5.4 kg). Based on the experiments performed, the yields from lead and PbO$_2$ electrodes to PbI$_2$ are 95.6% and 97.8%, respectively, which is expected to produce 21.5 kg of PbI$_2$. By considering the structure of PSCs (~500 nm-thick PbI$_2$ coating) and the material loss during the spin-coating process (~89.6%), 21.5 kg of PbI$_2$ enables the fabrication of ~709.0 m$^2$ PSCs.

Since the solar illumination varies in different locations, multiple locations (e.g., Cambridge, Mass., US; Las Vegas, Nev., US; London, UK) are chosen and analyzed. If the PCE achieves ~15% (close to the reported PCEs of PSCs in the literature), the resulting perovskite solar panels can generate ~398.8 kWh day-1 based on the annual average illumination in MIT, Cambridge, Mass. (~3.75 kWh M$^{-2}$ day$^{-1}$). The generated energy meets the electricity usage for ~13.7 US residential units (average daily electricity consumption for an United States residential unit is 29.1 kWh day-1). In the other words, ~51.7 m$^2$ perovskite solar panels are required to be installed to provide sufficient electricity for the daily usage of a single US residential unit in Cambridge. See, Electric power annual, U.S. Energy Information Administration, 2013, and Historical average annual prices by state by type of customer and provider, U.S. Energy Information Administration, 2012, each of which is incorporated by reference in its entirety. If the perovskite solar panels are installed in Las Vegas, Nev. (the annual average illumination is ~8.25 kWh M$^{-2}$ day$^{-1}$), ~30.2 US residential units can be powered, and ~23.5 m$^2$ solar panels are required for each household in this region. In addition, the same-sized perovskite solar panels installed in London (the annual average illumination is ~3.11 kWh M$^{-2}$ day$^{-1}$), ~26.1 UK residential units can be powered (average daily electricity consumption for an United States residential unit is ~12.7 kWh day-1), and ~27.2 m$^2$ solar panels are required for each household in this region.

Moreover, using the United State as an example, to power the whole United States (3.9×1012 kWh year$^{31\ 1}$), about 12.2 million recycled car batteries, which is ~12% of the spent American vehicle and industrial batteries in 2007, 35 are required to fabricate 8634 km2-sized perovskite solar panels installed in Nevada, which is only ~3% of its total area. With great focus on improving the performance of PSCs in academia and installing the recycled system for PbI2 solution during spin-coating in industry, these numbers can be further calibrated and improved. With the assumption of a 25-year lifetime for the PSCs, the lead resourced from recycled car batteries in the whole US industry for the PSCs could power the US over 200 years. In addition, with the recycling and reusing the lead component within the used perovskite solar panels, the time required to find a lead replacement for high-efficiency PSCs can be further elongated.

In the disclosed environmentally-responsible synthetic pathway reusing car batteries for the fabrication of efficient PSCs, both the anodes and cathodes of car batteries serve as material sources for the synthesis of lead iodide perovskite materials. In contrast to the traditional lead extraction process, this synthesis pathway from recycled battery material occurs at a lower temperature (600° C.) and does not include the hazardous emission of lead vapor/dust and $CO_2$ to the environment. The lead iodide perovskite materials synthesized from car batteries and high-purity reagents demonstrate identical material characterizations. The photovoltaic performance of the PSCs synthesized by each route are the same, which demonstrates that device quality does not suffer from the materials sourced from spent car batteries. Also, EIS measurements reveal that each device type displays the same resistances of electron recombination, indicating that the electron-transport properties of the lead iodide perovskite are identical. Finally, a simple economic analysis reveals that a single lead-acid car battery can supply enough lead material for the fabrication of ~709 $m^2$ PSCs, which can provide enough electricity to power 18.3 US residential units. The environmentally-responsible fabrication is expected to be broadly applicable not only to the PSC technology but also other applications (including but not limited to lead sulfide (PbS) quantum-dot solar cells, lead zirconate titanate (PZT) piezoelectric devices), and the recycling strategy will have important industrial implications in the future.

Regardless of the lead sulfate ($PbSO_4$) content in a discarded lead-acid car battery, this method is still valid because there would still be 40-50% lead and lead oxide content available for reprocessing into $PbI_2$ using this method. The motorists could have the battery replaced preemptively during routine car servicing or there could be physical issues, such as leaking electrolyte or defects in the membranes separating cells. Also in the future when lead-acid batteries are obsolesced by next-generation technology and are no longer reprocessed by battery manufacturers, all lead-acid car batteries regardless of their state of usage or $PbSO_4$ content will need to be either repurposed or safely disposed. This method provides a solution to this situation by demonstrating a process that allows the battery electrode materials to be transformed all the way from hazardous waste into functioning perovskite solar cells. Although $PbSO_4$ can indeed be converted into $PbI_2$ using this method, even if this were not the case, repurposing any hazardous waste for renewable energy generation is a significant achievement.

To prove that $PbSO_4$ can be converted into $PbI_2$ using this method, the method was performed using mixtures of pure materials sourced from Sigma-Aldrich that normally comprise the cathodes ($PbO_2$ and $PbSO_4$) and anodes (Pb and $PbSO_4$) of the lead-acid car battery. As demonstrated by x-ray diffraction (XRD) measurements, in every case, the material was converted into $PbI_2$ with yields exceeding 85%, regardless of initial $PbSO_4$ content. This is true even when using pure $PbSO_4$ (i.e. no $PbO_2$ or Pb) as the starting material. Although $PbSO_4$ has low solubility in nitric acid, the addition of excess KI to the solution would drive the reaction and promote the full dissociation of $PbSO_4$ over time, and therefore it is possible to convert $PbSO_4$ to $PbI_2$.

This method can successfully produce $PbI_2$ from both anode and cathode material collected from car batteries that were discarded after various states of use. For the examples below, the length of time a recently discarded battery was in operation before being replaced was determined from its serial number. From a set of recently discarded lead-acid batteries, three were chosen that had been in-use for about 0.5, 2, and 4 years before being replaced. The material from each battery was characterized with XRD and x-ray photo-electron spectroscopy (XPS) before and after conversion. The findings not only demonstrate that the material composition of the electrodes before recycling is indeed diverse, but that $PbI_2$ was successfully recycled from each sample with high yield and with only trace, if any, $PbSO_4$ present in the final product. Thus, this method is suitable to practically reuse material from car batteries discarded after any state of use.

In addition, this method can be improved to be performed at room temperature. By using hydrogen peroxide to convert the $PbO_2$ collected from battery cathodes into PbO, high temperature roasting can be avoided, thus achieving an efficient synthetic pathway that can be performed entirely under ambient conditions. This modification is not necessary for the conversion of $PbSO_4$ into $PbI_2$. As discussed above and in extensive detail below, this method can accomplish conversion in high yields.

In summary, this method enables reclaiming discarded and toxic battery electrode materials and produces precursors of sufficient quality to make perovskite solar cells with respectable performance.

EXAMPLES

Materials Synthesis

Lead, lead dioxide ($PbO_2$), lead iodide ($PbI_2$), potassium iodide (KI), 2-propanol (IPA), nitric acid ($HNO_3$), acetic acid, N,N-dimethylformamide (DMF), hydrochloric acid (HCl), hydroiodic acid (HI), methylamine ($CH_3NH_2$), zinc powder, and titanium isopropoxide (TTIP), titanium tetrachloride ($TiCl_4$) were purchased from Sigma-Aldrich. Lead oxide (PbO) was purchased from Alfa-Aesar. Fluorine-dope tin oxide (FTO) glass (TEC 15, thickness=2.2 mm) was purchased from Pilkington. 2,2',7,7'-Tetrakis(N,N-p-dimethoxyphenylamino)-9,9'-spirobifluorene (Spiro-MeOTAD) was purchased from SunaTech Incorporation (China) Gold target was purchased from R. D. Mathis Company. All reagents were used as received and without further purification. All water was deionized (18.2 MΩ, mill-Q pore). $CH_3NH_3I$ was synthesized according to a reported procedure[6]. HI solution (30 mL, 57 wt. % in water) and $CH_3NH_2$ solution (27.8 mL 40 wt. % in methanol) were mixed and stirred in the ice bath for 2 hours. $CH_3NH_3I$ was then crystallized by removing the solvent in an evaporator, washing three times in diethyl ether for 30 minutes, and filtering the precipitate. The material, in the form of white crystals, was then dried in vacuum at 60° C. for 24 hours. It was then kept in a dark, dry environment until further use.

Harvesting Material from the Anodes and Cathodes of Car Battery

The recycling process of anodes and cathodes of car battery was conducted by automobile maintenance station (Hung-Fu Incorporation, Taiwan). Car battery (Yuasa Batteries, standard type, 12-V) was disconnected from a Japanese automobile (Nissan Cefiro). The acid electrolyte was poured out and carefully collected, and the electrodes as well as the inner wall of car battery were rinsed several times by clean water. CAUTIONS: the electrolyte contains concentrated sulfuric acid (~4.2 M), and gloves, safety glasses, and lab coat are highly required during this process. The as-obtained car battery was dried in the ambient condition for 3 days. The dry car battery was disassembled from the top lid and then sawed from the sides to extract the electrode panels. After disassembling, the lead-derived materials (i.e., lead and $PbO_2$) were scratched off from the current collectors separately, and washed with dilute HCl (0.1 M) and clean water sequentially. The collected materials were ground into powders for further synthesis.

Synthesizing PbI$_2$ from the Collected Materials of Car Battery

The lead-related materials from anodes (lead) and cathodes (PbO$_2$) were conducted in different synthetic pathways to generate PbI$_2$ in high yields. PbO$_2$ powder was first roasted at 600° C. for 5 hours to decompose it into PbO, and the color of the powder was changed from dark-brown to yellow. After roasting, the PbO powder was easily dissolved in dilute acetic acid (1.9 M) to release lead(II) ion (Pb$^{2-}$) in the solution. Pb powder from anodes was reduced into dilute HNO$_3$ (0.8 M) and Pb$^{2-}$ was released completely into the solution (CAUTIONS: this reaction generated reddish and toxic nitrogen dioxide gas and must be conducted in the fume hood). After Pb$^{2+}$ was present in the solutions, the solutions are mixed with KI solution. The yellow precipitate of PbI$_2$ was collected, further washed by cold water and dried in a vacuum chamber overnight. The as-synthesized PbI$_2$ was further ground into fine powder for further synthesis.

Synthesizing Lead Iodide Perovskite Materials

PbI$_2$ was dissolved in DMF at a concentration of 462 mg mL$^{-1}$(~1 M) under stirring at 80° C. The solution was kept at 80° C. during the whole procedure. The FTO substrates were then infiltrated with PbI$_2$ by spin-coating the solution at 6500 r.p.m. for 60 seconds and dried at 80° C. for 1 hour. After cooling to room temperature, the films were dipped in a solution of CH$_3$NH$_3$I in IPA (10 mg mL$^{-1}$) for 1 minute, rinsed with IPA and dried at 90° C. for 30 minutes. The optical absorption spectroscopy measurements were performed using a Beckman Coulter DU800 UV-Vis spectrophotometer. Surface morphology of the perovskite nanocrystals were investigated using a scanning electron microscope (SEM, Helios Nanolab 600 Dual Beam Focused Ion Beam System) operating at 10.0 kV for medium and high resolution imaging. Powder X-ray diffraction (XRD) patterns were collected (PANanalytical Multipurpose Diffractometer, Cu Kα radiation operated at 40 kV and 40 mA) using a step size of 0.02° with 6.0° per minute scan speeds under the following settings: 2° of anti-scatter slit, 6 mm of irradiated length of automatic mode and 0.04 rad of soller slit. Steady-state PL spectra were measured at room temperature on a HORIBA Jobin-Yvon Nanolog spectrometer equipped with a 450 W xenon arc lamp, single-grating excitation and double-grating emission monochromators (spectral resolution 1 nm) and a Hamamatsu R928 photomultiplier tube. Time-resolved photoluminescence (PL) measurements were performed using a time-correlated single-photon-counting option on the Nanolog (HORIBA Jobin-Yvon, FluoroHub). 610 nm light pulse from a laser NanoLED (the half-width at half-maximum (HWHM) is 1.39 ns, average power 2.4 pJ pulse$^{-1}$) was used to as excitation source. The emission photons dispersed by a double-grating emission monochromator was collected with a Hamamatsu R928 single-photon-counting detector. Time-resolved PL data was analyzed with software DAS6 (HORIBA Jobin-Yvon).

Device Fabrication

The FTO-coated glass substrates were patterned by photolithography and etched by zinc powder and HCl (2.0 M) for 5 minutes. The patterned substrates were rinsed with dilute hydrofluoric acid (5.0 wt. %) and cleaned by ultrasonication in an aqueous soap solution, milli-Q water, acetone, and IPA sequentially. The clean substrates were subjected to an O$_3$/ultraviolet treatment for 30 minutes. To make a dense titanium dioxide (TiO$_2$) blocking layer, the FTO glasses were coated with 0.15 M TTIP in ethanol solution by the spin-coating method at 3000 r.p.m. which were heated at 500° C. for 30 minutes. After the deposition, the substrates were treated in a 0.04 M aqueous solution of TiCl$_4$ for 30 minutes at 80° C., rinsed with milli-Q water and dried at 500° C. for 30 minutes. The TiO$_2$ paste with 20-nm-sized particles was synthesized according to a reported procedure.[20] The 500-nm-thick TiO$_2$ films are fabricated by spin-coating the paste at 2500 r.p.m. for 60 seconds. After drying at 100° C., the TiO$_2$ films were gradually heated to 500° C. for 30 minutes and cooled to room temperature. Lead iodide perovskite nanocrystals (i.e., CH$_3$NH$_3$PbI$_3$) was deposited on the TiO$_2$ films according to the procedure above. The hole-transporting material was then deposited by spin-coating at 4000 r.p.m. for 30 seconds. The spin-coating solution was prepared by dissolving 72.3 mg spiro-MeOTAD, 28.8 μL 4-tert-butylpyridine, 17.5 μL of a stock solution of 520 mg mL$^{-1}$ lithium bis(trifluoromethylsulphonyl) imide in acetonitrile in 1 mL chlorobenzene. Finally, 80 nm of gold was thermally evaporated on top of the device.

Characterization of Perovskite Solar Cells (PSCs)

Photovoltaic measurements were performed using an AM 1.5 solar simulator (Photo Emission Tech.). The power of the simulated light was calibrated to 100 mW cm$^{-2}$ by using a reference silicon photodiode with a power meter (1835-C, Newport) and a reference silicon solar cell to reduce the mismatch between the simulated light and AM 1.5. J-V curves were obtained by applying an external bias to the cell and measuring the generated photocurrent with a Keithley model 2400 digital source meter. The voltage step and delay time of photocurrent were 10 mV and 40 ms, respectively. Electrochemical impedance spectroscopy (EIS) of PSCs was measured using a Solartron 1260 frequency response analyzer. The photoanode was connected to the working electrode. The platinum electrode was connected to the auxiliary electrode and reference electrodes. The impedance measurements were carried out at forward bias in dark conditions. The spectra were measured at various forward bias voltages in the frequency range ~0.1 Hz to ~1 MHz with oscillation potential amplitudes of 10 mV at room temperature. The applied forward bias voltage was changed by 50 mV steps from 1000 mV to 0 mV. The obtained impedance spectra were fit to the reported model with Z-view software (v3.2b, Scribner Associates). See V. Gonzalez-Pedro, E. J. Juarez-Perez, W.-S. Arsyad, E. M. Barea, F. Fabregat-Santiago, I. Mora-Sero and J. Bisquert, *Nano Lett.*, 2014, 14, 888, and A. Dualeh, T. Moehl, N. Tétreault, J. Teuscher, P. Gao, M. K. Nazeeruddin and M. Grätzel, *ACS Nano*, 2014, 8, 362, each of which is incorporated by reference in its entirety.

Converting Pure PbSO$_4$ and Mixtures with PbO$_2$ and Pb into PbI$_2$

The method disclosed herein is capable of producing PbI$_2$ in high yield and purity from battery electrodes with a wide range of initial material compositions (e.g., Pb, PbO$_2$, and PbSO$_4$).

To demonstrate this, mixtures of Pb:PbSO$_4$ and PbO$_2$:PbSO$_4$ (Pb and PbO$_2$ were purchased from Sigma-Aldrich) in different weight ratios from 0:100 to 100:0 were prepared and utilized as starting materials for the synthesis of PbI$_2$. To synthesize PbI$_2$ from the anode-like material, the mixture of Pb:PbSO$_4$ was added into 1M HNO$_3$ and stirred vigorously for several hours. During this step, Pb was oxidized into Pb$^{2+}$ ions (Equation 1) and dissolved completely. In the meantime, PbSO$_4$ was slightly dissolved in the aqueous solution (~0.005 g per 100 mL), and Pb$^{2+}$ ions were partially released in HNO$_3$ (Equation 4). After Pb was completely dissolved in the acidic solution, a KI solution with 6 times molar ratio to total Pb content was then added into the solution containing $Pb^{2+}$, and yellow $PbI_2$ precipitated immediately (Equation 6). After the precipitation of solid $PbI_2$, the presence of excess $I^-$ ions in $HNO_3$ solution continued to drive the reaction (Equation 5) to the right side, resulting in the complete dissolution of remaining $PbSO_4$.

$$Pb(s)+4HNO_3(aq.) \rightarrow 2H_2O(l)+2NO_2(g)+Pb(NO_3)_2(aq.) \quad (4)$$

$$PbSO_4(s) \rightarrow (1-x)PbSO_4(s)+xSO_4^{2-}(aq.)+xPb^{2+}(aq.) \quad (5)$$

$$Pb^{2+}(aq.)+2I^-(aq.) \rightarrow PbI_2(s) \quad (6)$$

Likewise, to synthesize $PbI_2$ from the cathode-like material, the method described above was used. The mixture of $PbO_2:PbSO_4$ was first roasted at 600° C. for 5 hours to decompose $PbO_2$ into $PbO$ (Equation 7).

$$PbO_2(s) \rightarrow PbO(s)+1/2O_2(g) \quad (7)$$

After roasting, the PbO powder was easily dissolved in acidic solution (e.g., acetic acid or $HNO_3$) to release $Pb^{2+}$ into the solution (Equation 8).

$$PbO(s)+2H^+ \rightarrow Pb^{2+}(aq.)+H_2O(l) \quad (8)$$

When using acetic acid, the remaining $PbSO_4$ was separated by centrifugation, filtered, and transferred to $HNO_3$ to achieve a faster reaction rate. With this process, $Pb^{2-}$ ions were partially released in $HNO_3$ (Equation 5). KI solution was then added into the solution, and yellow $PbI_2$ powder precipitated immediately (Equation 6). The presence of excess $I^-$ ions in $HNO_3$ solution gradually kept driving the reaction (Equation 5) to the complete dissolution of remaining $PbSO_4$. Moreover, when using nitric acid, there is no need to filter out the $PbSO_4$; all Pb content including $PbSO_4$ can be converted into $PbI_2$ in one-pot processes following Equations 4-6.

Figure 10A:
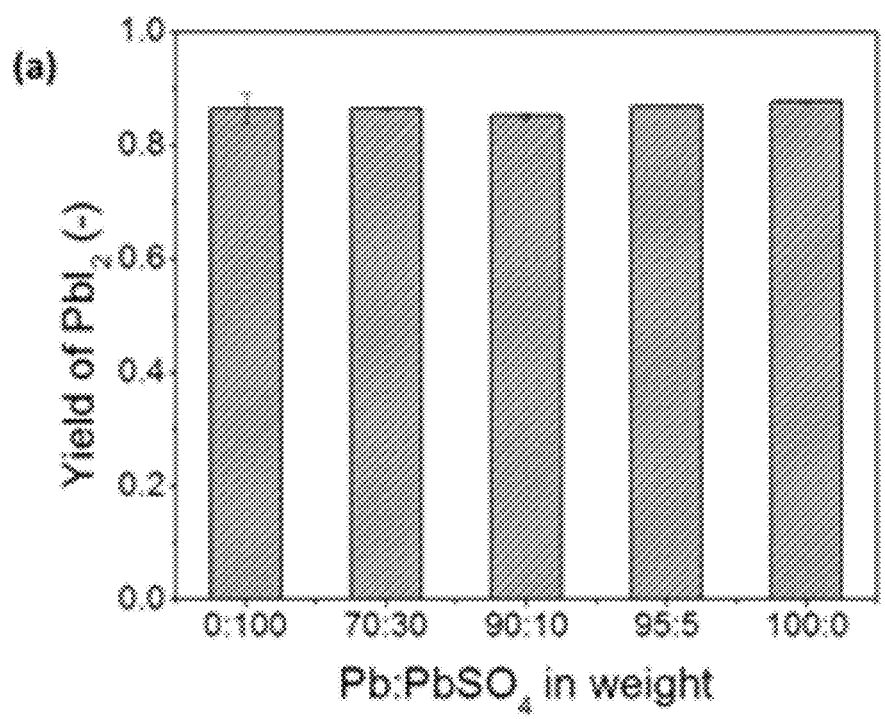
FIG. 10A shows the yield of $PbI_2$ synthesized from the mixtures of $Pb:PbSO_4$ in different weight ratios between 100:0 and 0:100 as starting materials.
Figure 10B:
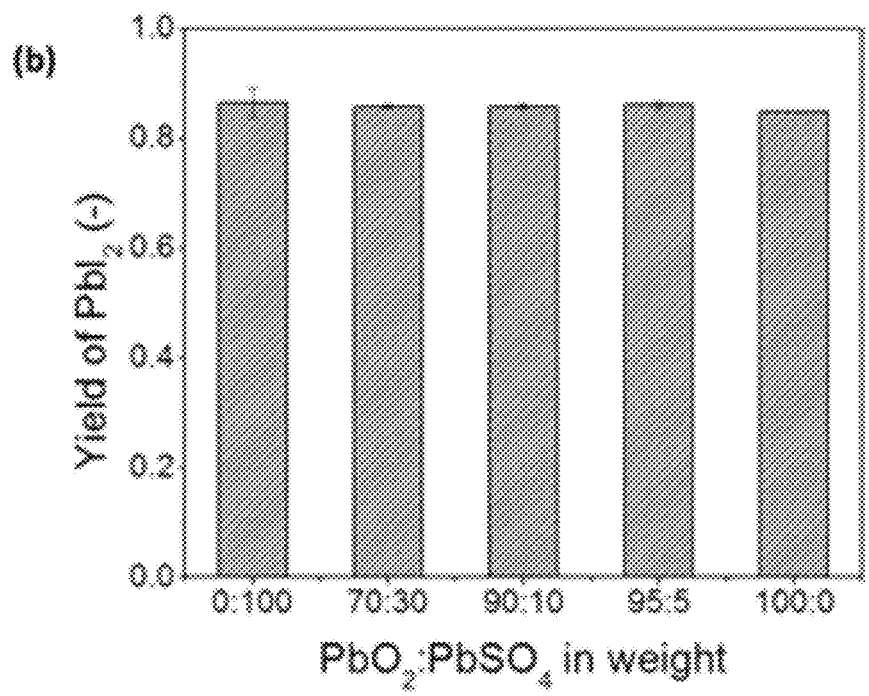
FIG. 10B shows the yield of $PbI_2$ synthesized from the mixtures of $PbO_2:PbSO_4$ in weight ratios between 100:0 and 0:100 as starting materials.
Figure 10C:
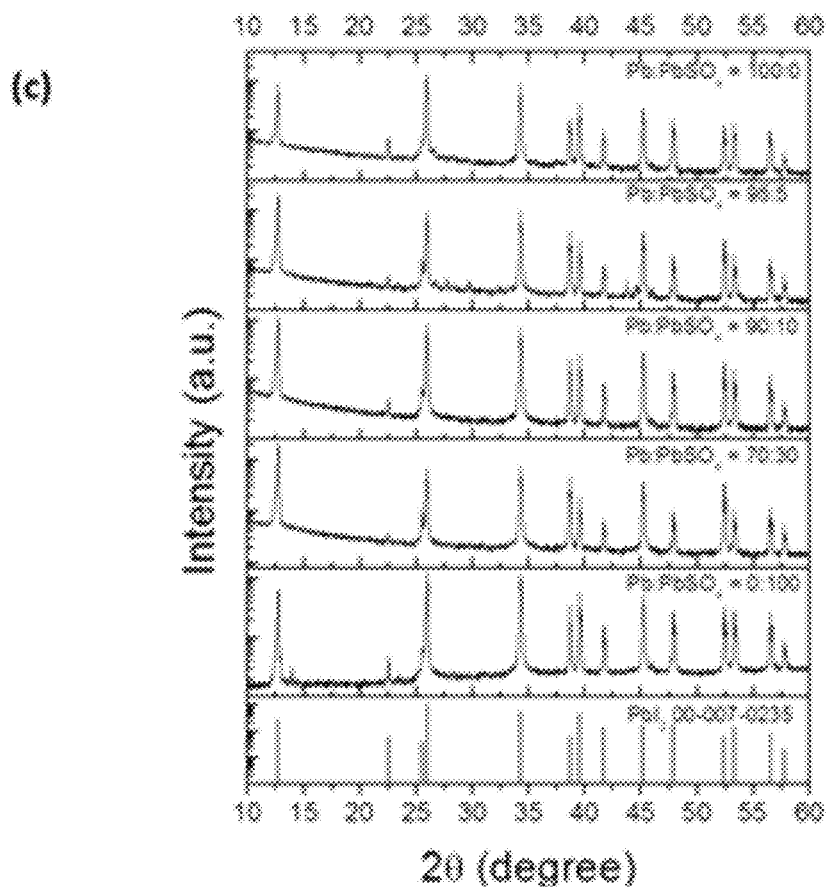
FIGS. 10C and 10D show XRD spectra of $PbI_2$ products synthesized from mixtures of $Pb:PbSO_4$ (FIG. 10C) and mixtures of $PbO_2:PbSO_4$ (FIG. 10D).
Figure 10D:
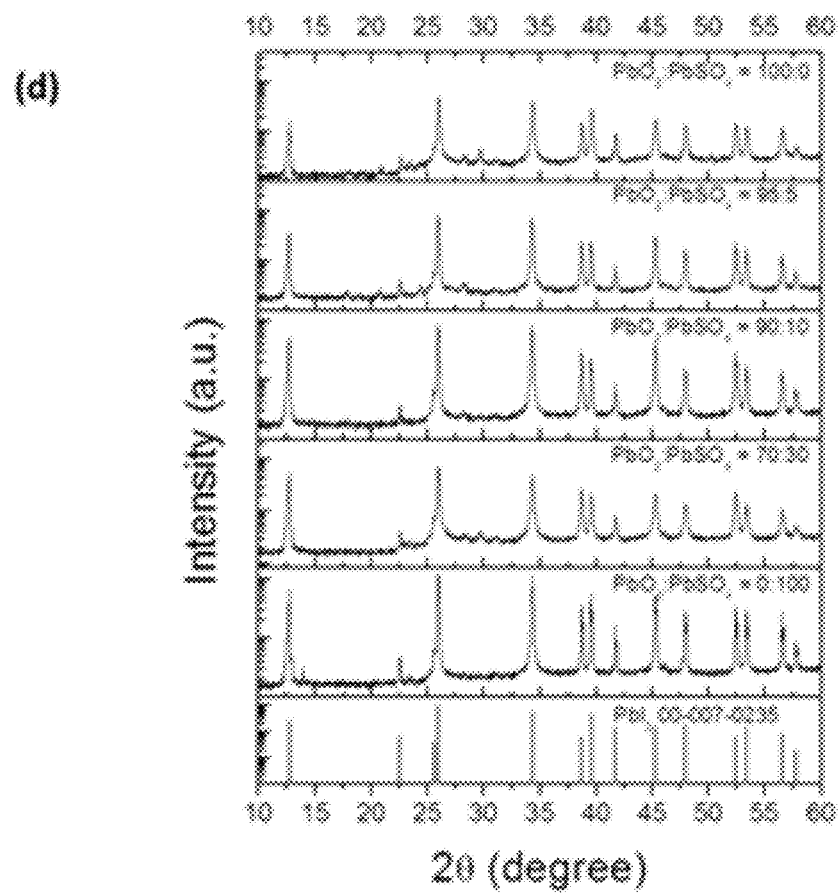

FIGS. 10A and 10B show that the yield of $PbI_2$ products synthesized from several different mixtures of $Pb:PbSO_2$ and $PbO_2:PbSO_4$, respectively. The figures demonstrate that these synthetic procedures enable the synthesis of $PbI_2$ in high yields (>85%) regardless of the $PbSO_4$ content in the initial mixture. Even with pure $PbSO_4$ as the starting material, a $PbI_2$ yield over 85% was achieved. Additionally, the purity of $PbI_2$ products were examined and characterized by XRD analysis, and the results are shown in FIGS. 10C and 10D. From XRD analysis, the $PbI_2$ products synthesized from either $Pb:PbSO_4$ or $PbO_2:PbSO_4$ mixtures, or even pure $PbSO_4$, were in high-purity and demonstrate identical patterns to the $PbI_2$ reference (PDF 00-007-0235), with no detectable $PbSO_4$ peaks. It should also be noted that the intensity of the XRD spectrum for each $PbI_2$ product is plotted with a logarithmic scale, so any peaks belong to impurities would be easily observed.

Figure 11A:
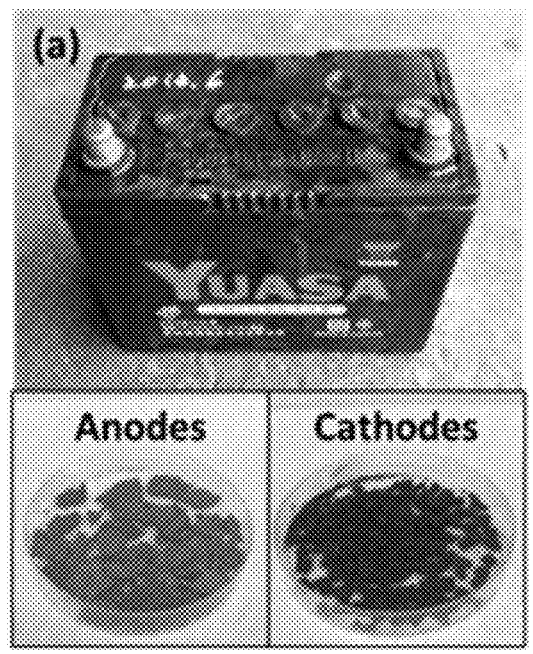
FIGS. 11A-11C show the photos of car batteries discarded after different operation times: half year, 2 years, and 4 years, respectively. The inset images are the collected anode (left) and cathode (right) materials.
Figure 11B:
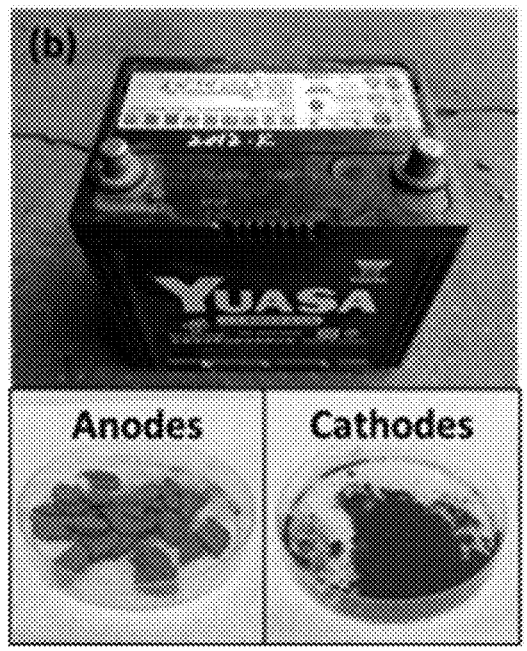
Figure 11C:
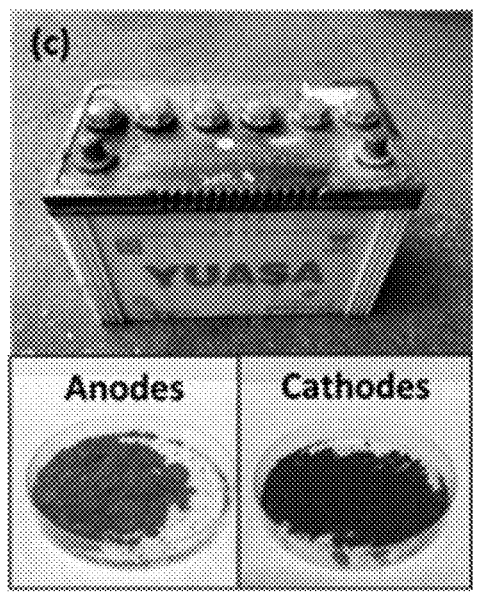

Converting the Electrode Materials from Car Batteries Discarded after Various Operation Times into $PbI_2$ To demonstrate that the synthetic approaches are applicable to spent car batteries that have been discarded after various states of use, three additional spent car batteries with operating years at half year (FIG. 11A), 2 years (FIG. 11B), and 4 years (FIG. 11C) were recycled. The time each battery spent in operation was confirmed with Yuasa Batteries Inc. through the serial number engraved on the outer casing of each spent battery. After the spent car batteries were disassembled, the anode and cathode materials were collected (shown in the insets of FIG. 11A-11C) and separately ground into fine powders for use as the starting materials in the synthesis of $PbI_2$.

Figure 12A:
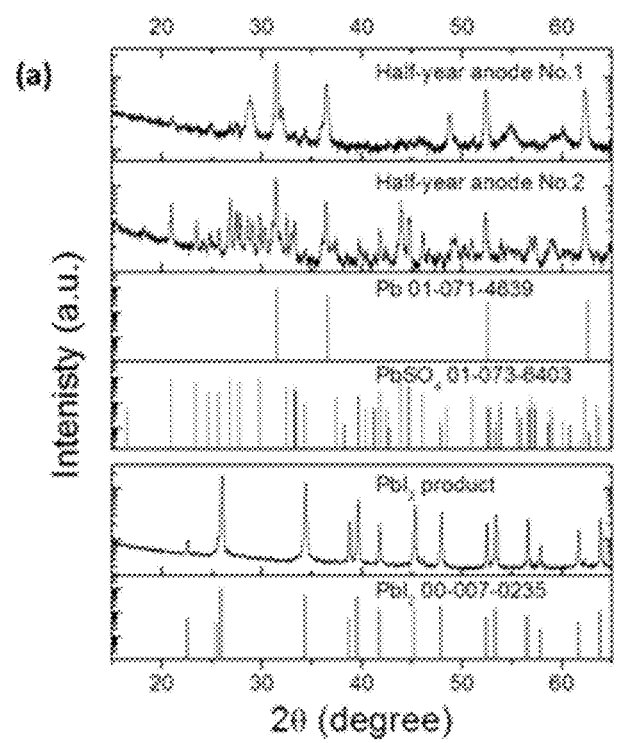
FIGS. 12A and 12B show XRD analysis of two anode panels (FIG. 12A) and two cathode panels (FIG. 12B) harvested from the spent car battery after operating for about a half year. The anode contains Pb and $PbSO_4$, and their diffraction patterns and PDF reference codes are provided. The cathode contains $PbO_2$ and $PbSO_4$, and their diffraction patterns and PDF reference codes are provided.
Figure 12B:
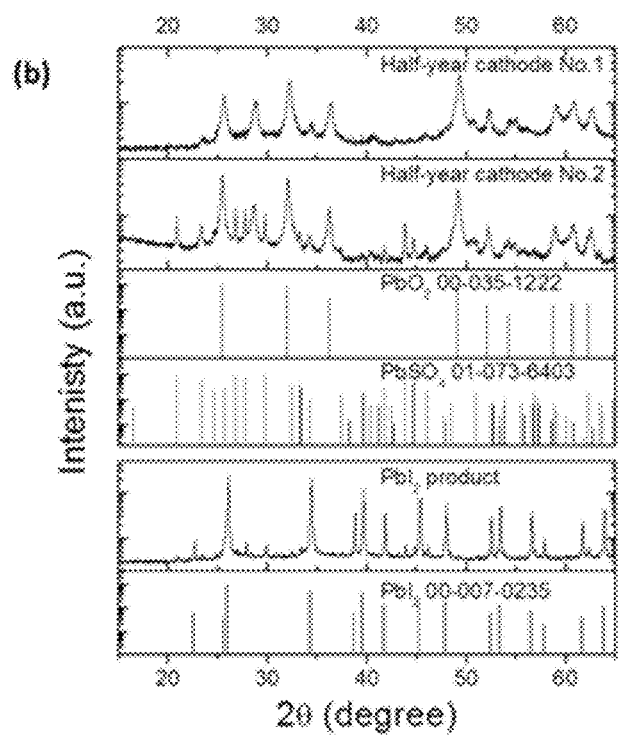
Figure 13A:
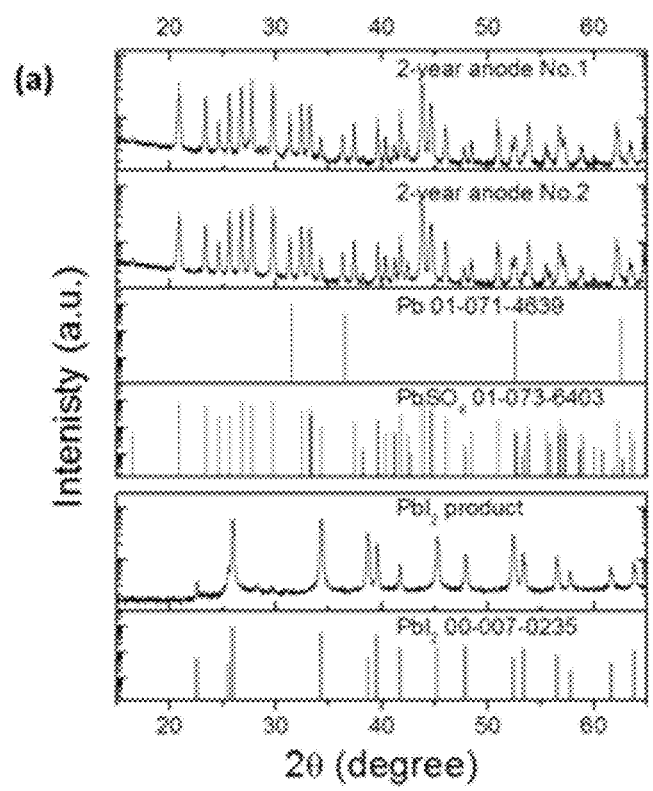
FIGS. 13A and 13B show XRD analysis of two anode panels (FIG. 13A) and two cathode panels (FIG. 13B) harvested from the spent car battery after operating for about two years. The anode contains Pb and $PbSO_4$, and their diffraction patterns and PDF reference codes are provided. The cathode contains $PbO_2$ and $PbSO_4$, and their diffraction patterns and PDF reference codes are provided.
Figure 13B:
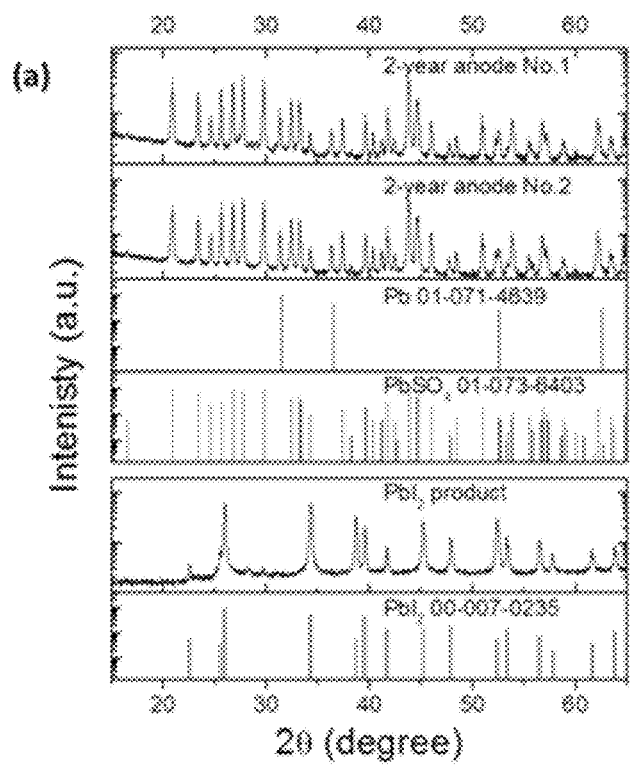
Figure 14A:
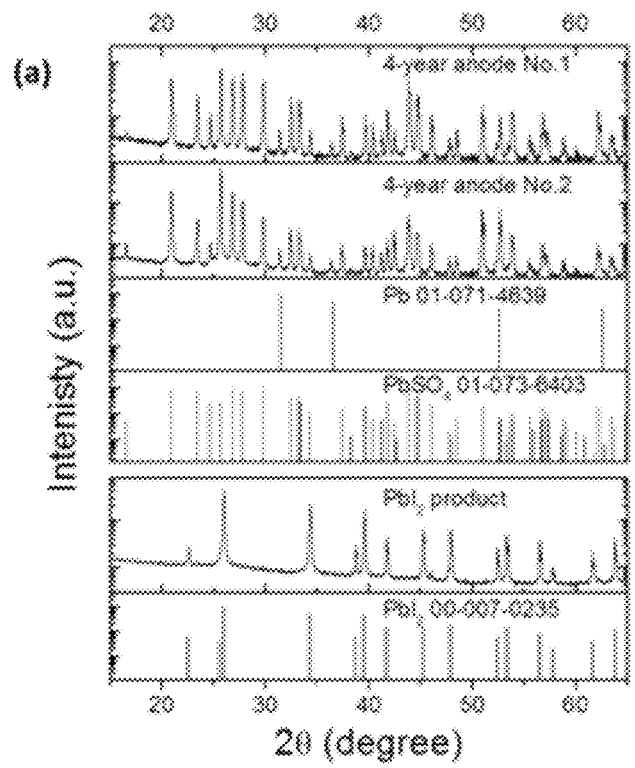
FIGS. 14A and 14B show XRD analysis of two anode panels (FIG. 14A) and two cathode panels (FIG. 14B) harvested from the spent car battery after operating for about four years. The anode contains Pb and $PbSO_4$, and their diffraction patterns and PDF reference codes are provided. The cathode contains $PbO_2$ and $PbSO_4$, and their diffraction patterns and PDF reference codes are provided.
Figure 14B:
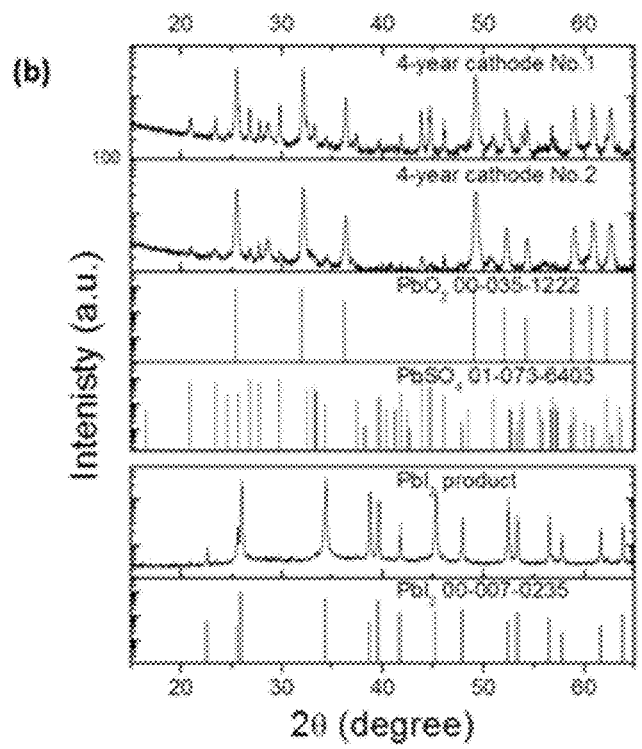

Two different panels of anodes and cathodes were collected from each spent car battery, and the composition of each panel was further characterized by XRD analysis. The XRD spectra of two anode panels and cathode panels from each spent car battery discarded after operating for a half year, 2 years, and 4 years are shown in the top half of FIGS. 12-14, respectively. The XRD spectra indicate that (1) the compositions of anode and cathode vary not only between spent batteries with different operating times but also between the electrode panels in the same battery (e.g., half-year-old battery). (2) All of the anodes contain Pb, and the composition of $PbSO_4$ increases as the operating time increases from a half year to 2 years and 4 years. (3) All of the cathodes contain $PbO_2$, and the composition of $PbSO_4$ increases as the operating time increases from a half year to 2 years and 4 years. To demonstrate that these synthetic approaches are applicable to the electrode materials with a wide range of compositions, the electrode panel with higher $PbSO_4$ content was selected as the starting material for the synthesis procedure. The selected starting materials are further characterized by XPS measurements, and the results are shown in FIG. 15B. The Pb, O, and S peaks shown in XPS measurements further demonstrate that $PbSO_4$ exists in all of starting materials used for synthesis of $PbI_2$.

Figure 15C:
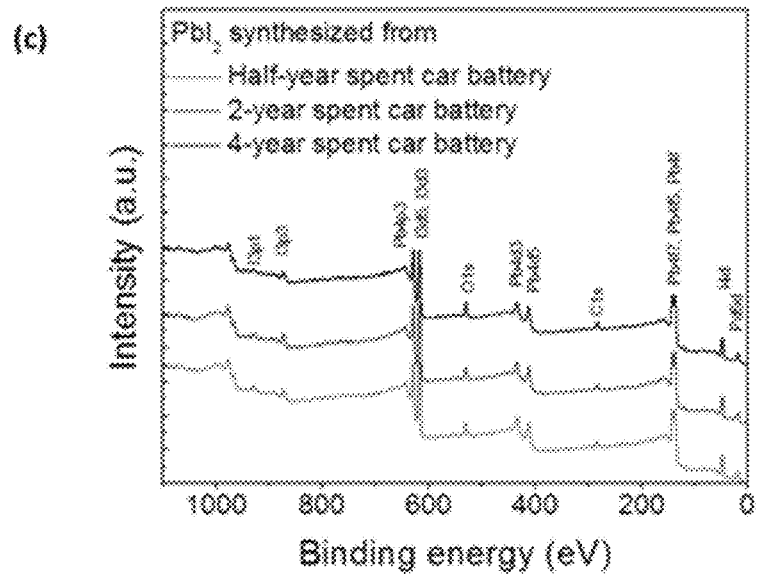

After conducting the appropriate synthesis procedure separately to the spent cathode and anode materials, the as-synthesized $PbI_2$ products were collected, and their masses were weighed by microbalance and plotted in FIG. 15A. In FIG. 15A, the mass of $PbI_2$ synthesized from one gram of spent anode or cathode materials ranged from 1.4 to 2.2 grams. Additionally, the synthesized $PbI_2$ products were characterized by XPS measurements, and the results are shown in FIG. 15C. The appearance of Pb and I peaks and the disappearance of S peak compared to FIG. 15B indicate the successful transformation of $PbI_2$ from $PbSO_4$ in spent electrode materials. Furthermore, the purity of $PbI_2$ products synthesized from anode and cathode materials were examined and characterized by XRD analysis, and the results are shown in the bottom half of FIGS. 12-14. It is clear from the XRD spectra that the $PbI_2$ products were all in high-purity and demonstrate identical patterns as $PbI_2$ (PDF 00-007-0235), which proves that disclosed synthetic pathways are capable of successfully converting spent electrode materials with a wide range of initial compositions (e.g., Pb, $PbO_2$, and $PbSO_4$).

New Procedure for Room-Temperature $PbI_2$ Synthesis

An improved one-pot procedure at room temperature that adds $H_2O_2$ solution into the acidic solution to reduce $PbO_2$ to PbO was developed (Equation 9).

$$PbO_2+H_2O_2 \rightarrow PbO+H_2O+O_2 \quad (9)$$

Figure 16:
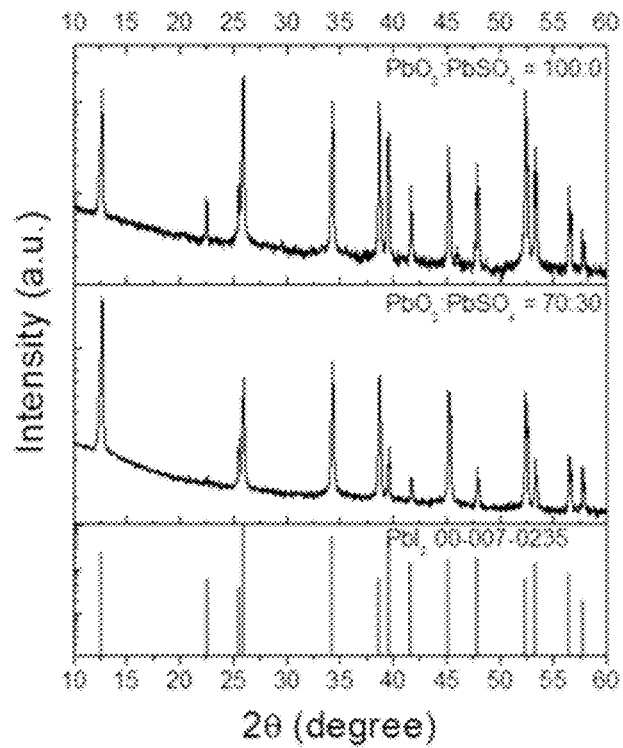
FIG. 16 shows room-temperature synthesis of $PbI_2$.

Once $PbO_2$ is reduced to PbO, PbO dissociates completely into solution at room temperature (Equation 8). After the complete dissolution of PbO, the remaining $PbSO_4$ can be fully dissolved and transformed into $PbI_2$ by adding a concentrated KI solution to the mixture (Equations 4-6). From XRD analysis in FIG. 16, the as-synthesized $PbI_2$ products generated from either pure $PbO_2$ or a mixture of $PbO_2:PbSO_4$ (70:30) are high-purity and demonstrate XRD spectra identical to $PbI_2$ (PDF 00-007-0235). The figures demonstrate that the room-temperature synthetic procedures enable the synthesis of high purity $PbI_2$.

Experimental Details:

Materials

Lead (Pb), lead dioxide ($PbO_2$), lead sulfate ($PbSO_4$), potassium iodide (KI), nitric acid ($HNO_3$), and acetic acid were purchased from Sigma-Aldrich. All reagents were used as received and without further purification. All water was deionized (18.2 MΩ, mill-Q pore). The spent car batteries were provided by Yuasa Batteries Incorporation. Three spent car batteries that were in operation for a half year, 2 years, and 4 years were recycled, and the corresponding operating time was confirmed by Yuasa Batteries Inc. via the serial numbers engraved on the battery casing.

Synthesizing $PbI_2$ from the Mixtures of $Pb:PbSO_4$ and $PbO_2:PbSO_4$

Mixtures of $Pb:PbSO_4$ and $PbO_2:PbSO_4$ in weight ratios ranging from 0:100 to 100:0 were prepared as the starting materials for the synthesis of $PbI_2$. Different synthetic pathways were conducted on the mixture of $Pb:PbSO_4$ and $PbO_2:PbSO_4$. For $Pb:PbSO_4$ mixtures, 0.5 grams of mixture was added into 100 mL of 1M $HNO_3$ with vigorous stirring. After continuous stirring for 2-4 hours, Pb powder was completely dissolved and a KI solution (in 6 times excess to Pb content) was added into the solution. The yellow precipitation (i.e., $PbI_2$) was formed immediately, and the solution was stirred overnight to complete the transformation from $PbSO_4$ to $PbI_2$. Afterwards, a small amount of acetone or isopropanol was used to wash away the precipitates adhered to the inner wall of the container. For $PbO_2:PbSO_4$ mixtures, 0.5 grams of the mixture were first roasted at 600° C. for 5 hours to decompose $PbO_2$ into PbO. The annealed mixture was added into 100 mL of 1M $HNO_3$ or 1.9 M acetic acid with vigorous stirring. After continuous stirring for 2-4 hours, PbO component was completely dissolved. The remaining solid (i.e. $PbSO_4$) was transferred into 1M $HNO_3$, and a KI solution (in 6 times excess to Pb content) was added into the solutions. A yellow precipitate formed immediately, and the solution was stirred overnight, and a small amount of acetone or isopropanol was again used to wash away the precipitates adhered to the inner wall of the container. The yellow precipitate of $PbI_2$ was collected by centrifugation or filtration, washed with cold water twice and centrifuged to remove the ions of $K^+$, $I^-$ and $SO_4^{2-}$ from the final solution and dried in a vacuum chamber at 80° C. for at least 3 hours. Here, cold water was used to wash the products in order to minimize the loss $PbI_2$ (the solubility of $PbI_2$ decreases from 0.076 g/100 mL at 20° C. to 0.044 g/100 mL at 0° C.).

Synthesizing $PbI_2$ from the Mixture of $PbO_2:PbSO_4$ at Room Temperature

Mixtures of $PbO_2:PbSO_4$ in weight ratios ranging from 100:0 to 70:30 were prepared as the starting materials for the synthesis of $PbI_2$. 0.5 grams of each mixture was added into 20 mL of 1M $HNO_3$ with vigorous stirring. After continuous stirring for 1 hour, $H_2O_2$ of 3wt % was slowly added into solution, while the color of solution gradually changed from black-brown to clear (100% $PbO_2$ case) or cloudy white (with $PbSO_4$). The addition of $H_2O_2$ was halted once the dark brown color of the solution completely disappeared. A KI solution (in 6 times excess to Pb content) was then added causing the immediate precipitation of yellow $PbI_2$. Afterwards, a small amount of acetone was used to wash away the precipitates that had adhered to the inner wall of the container. The solution was stirred overnight. The as-synthesized $PbI_2$ was washed once more and collected via centrifugation.

Harvesting Material from the Anodes and Cathodes of Car Battery

The recycling process of anodes and cathodes of car battery was conducted at an automobile maintenance station (Hung-Fu Incorporation, Taiwan). The acid electrolyte (concentrated sulfuric acid. CAREFUL! Gloves, safety glasses, and personal protection are required during this process!) was poured out and carefully collected, and the electrodes as well as the inner wall of the car battery were rinsed several times with clean water. The as-obtained car battery was dried in the ambient condition for 3 days. The dry car battery was disassembled from the top lid or the sidewall to extract the electrode panels. After disassembling, the lead-based materials were scratched off from the current collectors separately and were ground into powders for further synthesis.

Synthesizing $PbI_2$ from the Collected Materials of Spent Car Battery

The lead-based materials collected from the anodes and cathodes were first crushed and ground into fine powders, and then converted using different synthetic pathways to generate $PbI_2$ in high yields. For the material collected from anodes, 1 grams of starting material was added into 100 mL of 1M $HNO_3$ with vigorous stirring. After continuous stirring for 2-4 hours, Pb powder was completely dissolved and a KI solution (in 6 times excess to Pb content) was added into the solution. A yellow precipitate (i.e., $PbI_2$) was formed immediately, and the solution was stirred overnight to complete the transformation from $PbSO_4$ to $PbI_2$. Afterwards, a small amount of acetone or isopropanol was used to wash away the precipitates adhered to the inner wall of the container. For the material collected from anodes, 1 grams of starting material was first roasted at 600° C. for 5 hours and added into 100 mL of 1M $HNO_3$. After continuous stirring for 2-4 hours, a KI solution (in 6 times excess to Pb content) was added into the solutions. A yellow precipitate formed immediately, and the solution was stirred overnight, and a small amount of acetone or isopropanol was again used to wash away the precipitates adhered to the inner wall of the container. The yellow precipitate of $PbI_2$ was collected, further washed by cold water twice and dried in a vacuum chamber at 80° C. for at least 3 hours. The as-synthesized $PbI_2$ was weighed by a microbalance and ground into fine powder.

Characterization

Powder X-ray diffraction (XRD) patterns were collected (PANanalytical Multipurpose Diffractometer, Cu Kα radiation operated at 40 kV and 40 mA) using a step size of 0.02° with 6.0° per minute scan speeds under the following settings: 2° of anti-scatter slit, 6 mm of irradiated length of automatic mode and 0.04 rad of soller slit. X-ray photoelectron spectrometer (XPS) (PHI Versa-Probe II) with a scanning monochromated Al source (1100 eV survey scan; 50 W; spot size, 200 μm; 90° angle of incidence) was used to quantify the surface composition of thin films.

Other embodiments are within the scope of the following claims.

What is claimed is:

1. A method of fabricating perovskite solar cells comprising:
   harvesting lead-derived materials from the anodes and cathodes of a car battery as a recovery solution;
   synthesizing recovered lead iodide from the lead-derived materials from the recovery solution;
   forming recovered lead iodide perovskite nanocrystals from the recovered lead iodide; and
   depositing the recovered lead iodide perovskite nanocrystals on a substrate.

2. The method of claim 1, wherein the perovskite has the formula (I):

$$A_xA'_{1-x}B_yB'_{1-y}O_{3\pm\delta} \qquad (I)$$

wherein each of A and A', independently, is a rare earth, alkaline earth metal, or alkali metal;

each of B and B', independently, is a transition metal;

x is in the range of 0 to 1;

y is in the range of 0 to 1; and

δ is in the range of 0 to 1.

3. The method of claim 2, wherein A and A', independently, are selected from the group consisting of methylammonium, 5-aminovaleric acid, Mg, Ca, Sr, Ba, Pb, and Bi; and B and B', independently, are selected from the group consisting of Pb, Sn, Ti, Zr, V, Nb, Mn, Fe, Ru, Co, Rh, Ni, Pd, Pt, Al, and Mg.

4. The method of claim 2, wherein the perovskite is a strontium titanate.

5. The method of claim 2, wherein the perovskite is a bismuth ferrite.

6. The method of claim 2, wherein the perovskite is a tantalum oxide, tantalum oxynitride or tantalum nitride.

7. The method of claim 6, wherein the perovskite is sodium tantalate, zirconium oxide/tantalum oxynitride, zirconium tantalum oxynitride, tantalum oxynitride, tantalum nitride, or zirconium tantalum nitride.

8. The method of claim 1, wherein the perovskite has the formula (II):

$$A_xB_yX_3 \quad (II)$$

wherein

A is methylammonium or 5-aminovaleric acid;

B is Pb or Sn;

X is I, Br, or Cl;

x is in the range of 0 to 1; and y is in the range of 0 to 1.

9. The method of claim 1, wherein the anodes or cathodes of the car battery include lead sulphate ($PbSO_4$).

10. The method of claim 1, wherein the lead iodide is synthesized at room temperature.

11. The method of claim 1, wherein hydrogen peroxide is added to synthesize the recovered lead iodide.

12. The method of claim 1, wherein harvesting lead-derived materials from the anodes and cathodes of a car battery as a recovery solution includes adding peroxide to an acidic solution including $PbO_2$.

* * * * *